US011967575B2

(12) United States Patent
Gao et al.

(10) Patent No.: US 11,967,575 B2
(45) Date of Patent: Apr. 23, 2024

(54) BOND ENHANCEMENT STRUCTURE IN MICROELECTRONICS FOR TRAPPING CONTAMINANTS DURING DIRECT-BONDING PROCESSES

(71) Applicant: ADEIA SEMICONDUCTOR BONDING TECHNOLOGIES INC., San Jose, CA (US)

(72) Inventors: Guilian Gao, San Jose, CA (US); Javier A. DeLaCruz, San Jose, CA (US); Shaowu Huang, Sunnyvale, CA (US); Liang Wang, Newark, CA (US); Gaius Gillman Fountain, Jr., Youngsville, NC (US); Rajesh Katkar, Milpitas, CA (US); Cyprian Emeka Uzoh, San Jose, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 223 days.

(21) Appl. No.: 17/681,019

(22) Filed: Feb. 25, 2022

(65) Prior Publication Data
US 2022/0246564 A1 Aug. 4, 2022

Related U.S. Application Data

(63) Continuation of application No. 16/553,535, filed on Aug. 28, 2019, now Pat. No. 11,296,044.
(Continued)

(51) Int. Cl.
*H01L 23/00* (2006.01)
(52) U.S. Cl.
CPC .............. *H01L 24/08* (2013.01); *H01L 24/05* (2013.01); *H01L 24/06* (2013.01); *H01L 24/74* (2013.01);
(Continued)

(58) Field of Classification Search
CPC . H01L 2224/80908; H01L 2224/80365; H01L 2224/94; H01L 2224/02233;
(Continued)

(56) References Cited

U.S. PATENT DOCUMENTS 5,341,979 A 8/1994 Gupta
5,753,536 A 5/1998 Sugiyama et al.
(Continued)

FOREIGN PATENT DOCUMENTS

CN 103681646 3/2014
EP 2 339 614 A1 6/2011
(Continued)

OTHER PUBLICATIONS

Bush, Steve, "Electronica: Automotive power modules from on Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).
(Continued)

*Primary Examiner* — Mohammad M Hoque
(74) *Attorney, Agent, or Firm* — Knobbe, Martens, Olson & Bear, LLP

(57) ABSTRACT

Structures and techniques provide bond enhancement in microelectronics by trapping contaminants and byproducts during bonding processes, and arresting cracks. Example bonding surfaces are provided with recesses, sinks, traps, or cavities to capture small particles and gaseous byproducts of bonding that would otherwise create detrimental voids between microscale surfaces being joined, and to arrest cracks. Such random voids would compromise bond integrity and electrical conductivity of interconnects being bonded. In example systems, a predesigned recess space or
(Continued)

predesigned pattern of recesses placed in the bonding interface captures particles and gases, reducing the formation of random voids, thereby improving and protecting the bond as it forms. The recess space or pattern of recesses may be placed where particles collect on the bonding surface, through example methods of determining where mobilized particles move during bond wave propagation. A recess may be repeated in a stepped reticule pattern at the wafer level, for example, or placed by an aligner or alignment process.

20 Claims, 17 Drawing Sheets

Related U.S. Application Data

(60) Provisional application No. 62/724,270, filed on Aug. 29, 2018.

(52) U.S. Cl.
CPC .............. *H01L 24/80* (2013.01); *H01L 24/89* (2013.01); *H01L 2224/05557* (2013.01); *H01L 2224/06131* (2013.01); *H01L 2224/06177* (2013.01); *H01L 2224/08147* (2013.01); *H01L 2224/80007* (2013.01); *H01L 2224/80011* (2013.01); *H01L 2224/80031* (2013.01); *H01L 2224/80047* (2013.01); *H01L 2224/8013* (2013.01); *H01L 2224/80895* (2013.01); *H01L 2224/80896* (2013.01); *H01L 2924/3512* (2013.01)

(58) Field of Classification Search
CPC . H01L 2224/02255; H01L 2224/80012; H01L 2224/80357; H01L 2224/08145
USPC ......................................................... 257/773
See application file for complete search history.

(56) References Cited

U.S. PATENT DOCUMENTS

| | | |
|---|---|---|
| 5,771,555 A | 6/1998 | Eda et al. |
| 6,080,640 A | 6/2000 | Gardner et al. |
| 6,423,640 B1 | 7/2002 | Lee et al. |
| 6,465,892 B1 | 10/2002 | Suga |
| 6,887,769 B2 | 5/2005 | Kellar et al. |
| 6,908,027 B2 | 6/2005 | Tolchinsky et al. |
| 7,045,453 B2 | 5/2006 | Canaperi et al. |
| 7,105,980 B2 | 9/2006 | Abbott et al. |
| 7,193,423 B1 | 3/2007 | Dalton et al. |
| 7,385,283 B2 | 6/2008 | Wu et al. |
| 7,566,634 B2 | 7/2009 | Beyne et al. |
| 7,750,488 B2 | 7/2010 | Patti et al. |
| 7,790,578 B2 | 9/2010 | Furui |
| 7,803,693 B2 | 9/2010 | Trezza |
| 8,026,181 B2 | 9/2011 | Arita et al. |
| 8,147,630 B2 | 4/2012 | George |
| 8,183,127 B2 | 5/2012 | Patti et al. |
| 8,349,635 B1 | 1/2013 | Gan et al. |
| 8,377,798 B2 | 2/2013 | Peng et al. |
| 8,441,131 B2 | 5/2013 | Ryan |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,513,088 B2 | 8/2013 | Yoshimura et al. |
| 8,513,810 B2 | 8/2013 | Tago |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 8,901,736 B2 | 12/2014 | Shen et al. |
| 8,975,163 B1 | 3/2015 | Lei et al. |
| 9,029,242 B2 | 5/2015 | Holden et al. |
| 9,076,860 B1 | 7/2015 | Lei et al. |
| 9,076,929 B2 | 7/2015 | Katsuno et al. |
| 9,093,350 B2 | 7/2015 | Endo et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,373,527 B2 | 6/2016 | Yu et al. |
| 9,385,024 B2 | 7/2016 | Tong et al. |
| 9,391,143 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,524,959 B1 | 12/2016 | Yeh et al. |
| 9,536,848 B2 | 1/2017 | England et al. |
| 9,559,081 B1 | 1/2017 | Lai et al. |
| 9,564,414 B2 | 2/2017 | Enquist et al. |
| 9,620,481 B2 | 4/2017 | Edelstein et al. |
| 9,656,852 B2 | 5/2017 | Cheng et al. |
| 9,673,096 B2 | 6/2017 | Hirschler et al. |
| 9,674,939 B2 | 6/2017 | Scannell |
| 9,704,827 B2 | 7/2017 | Huang et al. |
| 9,716,033 B2 | 7/2017 | Enquist et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,768,133 B1 | 9/2017 | Wu et al. |
| 9,799,587 B2 | 10/2017 | Fujii et al. |
| 9,852,988 B2 | 12/2017 | Enquist et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,204,893 B2 | 2/2019 | Uzoh et al. |
| 10,269,756 B2 | 4/2019 | Uzoh |
| 10,276,619 B2 | 4/2019 | Kao et al. |
| 10,276,909 B2 | 4/2019 | Huang et al. |
| 10,410,976 B2 | 9/2019 | Asano et al. |
| 10,418,277 B2 | 9/2019 | Cheng et al. |
| 10,434,749 B2 | 10/2019 | Tong |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,522,499 B2 | 12/2019 | Enquist et al. |
| 10,707,087 B2 | 7/2020 | Uzoh et al. |
| 10,727,219 B2 | 7/2020 | Uzoh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |

(56) References Cited

U.S. PATENT DOCUMENTS

| | | |
|---|---|---|
| 10,985,204 B2 | 4/2021 | Von Kanel |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,056,390 B2 | 7/2021 | Uzoh et al. |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,158,573 B2 | 10/2021 | Uzoh et al. |
| 11,158,606 B2 | 10/2021 | Gao et al. |
| 11,169,326 B2 | 11/2021 | Huang et al. |
| 11,171,117 B2 | 11/2021 | Gao et al. |
| 11,176,450 B2 | 11/2021 | Teig et al. |
| 11,195,748 B2 | 12/2021 | Uzoh et al. |
| 11,205,625 B2 | 12/2021 | DeLaCruz et al. |
| 11,222,863 B2 | 1/2022 | Hua et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,296,053 B2 | 4/2022 | Uzoh et al. |
| 11,329,034 B2 | 5/2022 | Tao et al. |
| 11,348,898 B2 | 5/2022 | DeLaCruz et al. |
| 11,355,404 B2 | 6/2022 | Gao et al. |
| 11,355,443 B2 | 6/2022 | Huang et al. |
| 11,373,963 B2 | 6/2022 | DeLaCruz et al. |
| 11,385,278 B2 | 7/2022 | DeLaCruz et al. |
| 11,387,202 B2 | 7/2022 | Haba et al. |
| 11,387,214 B2 | 7/2022 | Wang et al. |
| 11,393,779 B2 | 7/2022 | Gao et al. |
| 11,437,423 B2 | 9/2022 | Takachi |
| 11,462,419 B2 | 10/2022 | Haba |
| 11,476,213 B2 | 10/2022 | Haba et al. |
| 11,515,291 B2 | 11/2022 | DeLaCruz et al. |
| 11,626,363 B2 | 4/2023 | Haba et al. |
| 11,631,647 B2 | 4/2023 | Haba |
| 11,652,083 B2 | 5/2023 | Uzoh et al. |
| 11,664,357 B2 | 5/2023 | Fountain, Jr. et al. |
| 11,721,653 B2 | 8/2023 | DeLaCruz et al. |
| 11,728,273 B2 | 8/2023 | Haba |
| 11,735,523 B2 | 8/2023 | Uzoh |
| 11,742,314 B2 | 8/2023 | Uzoh et al. |
| 11,749,645 B2 | 9/2023 | Gao et al. |
| 11,762,200 B2 | 9/2023 | Katkar et al. |
| 11,764,177 B2 | 9/2023 | Haba |
| 11,842,894 B2 | 12/2023 | Katkar et al. |
| 11,876,076 B2 | 1/2024 | DeLaCruz et al. |
| 2002/0003307 A1 | 1/2002 | Suga |
| 2003/0071106 A1 | 4/2003 | Bendat et al. |
| 2003/0148591 A1 | 8/2003 | Guo et al. |
| 2004/0084414 A1 | 5/2004 | Sakai et al. |
| 2005/0101130 A1 | 5/2005 | Lopatin et al. |
| 2005/0161795 A1 | 7/2005 | Tong et al. |
| 2005/0161808 A1 | 7/2005 | Anderson |
| 2006/0057945 A1 | 3/2006 | Hsu et al. |
| 2007/0111386 A1 | 5/2007 | Kim et al. |
| 2007/0123061 A1 | 5/2007 | Evertsen et al. |
| 2007/0148912 A1 | 6/2007 | Morita et al. |
| 2007/0262468 A1 | 11/2007 | Nasu et al. |
| 2008/0006938 A1 | 1/2008 | Patti et al. |
| 2008/0064189 A1 | 3/2008 | Daubenspeck et al. |
| 2008/0268614 A1 | 10/2008 | Yang et al. |
| 2009/0029274 A1 | 1/2009 | Olson et al. |
| 2009/0095399 A1 | 4/2009 | Zussy et al. |
| 2010/0096699 A1 | 4/2010 | Miyata |
| 2011/0084403 A1 | 4/2011 | Yang et al. |
| 2011/0308738 A1 | 12/2011 | Maki et al. |
| 2012/0068355 A1 | 3/2012 | Aoki et al. |
| 2012/0119258 A1 | 5/2012 | Liang |
| 2012/0238070 A1 | 9/2012 | Libbert et al. |
| 2013/0009321 A1 | 1/2013 | Kagawa et al. |
| 2014/0015088 A1 | 1/2014 | Chapelon |
| 2014/0145338 A1* | 5/2014 | Fujii ................ H01L 24/09 257/762 |
| 2014/0175655 A1 | 6/2014 | Chen et al. |
| 2014/0187040 A1 | 7/2014 | Enquist et al. |
| 2014/0264948 A1 | 9/2014 | Chou et al. |
| 2014/0319656 A1 | 10/2014 | Marchena et al. |
| 2015/0064498 A1 | 3/2015 | Tong |
| 2015/0145140 A1 | 5/2015 | Haba et al. |
| 2015/0364434 A1 | 12/2015 | Chen et al. |
| 2016/0013099 A1 | 1/2016 | Tanida et al. |
| 2016/0071770 A1 | 3/2016 | Albermann et al. |
| 2016/0181228 A1* | 6/2016 | Higuchi ........... H01L 25/0657 257/774 |
| 2016/0197055 A1 | 7/2016 | Yu et al. |
| 2016/0233175 A1 | 8/2016 | Dubey et al. |
| 2016/0343682 A1 | 11/2016 | Kawasaki |
| 2017/0154768 A1 | 6/2017 | Zhao |
| 2017/0200756 A1 | 7/2017 | Kao et al. |
| 2017/0250172 A1 | 8/2017 | Huang et al. |
| 2018/0102286 A1 | 4/2018 | Uzoh et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0226371 A1 | 8/2018 | Enquist |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0088527 A1 | 3/2019 | Uzoh |
| 2019/0115277 A1 | 4/2019 | Yu et al. |
| 2019/0131277 A1 | 5/2019 | Yang et al. |
| 2019/0148336 A1* | 5/2019 | Chen ................ H01L 21/4857 257/774 |
| 2019/0152773 A1* | 5/2019 | Herbsommer ...... B81C 1/00047 |
| 2019/0198409 A1* | 6/2019 | Katkar .............. B81B 7/0038 |
| 2019/0333550 A1 | 10/2019 | Fisch |
| 2019/0371763 A1 | 12/2019 | Agarwal et al. |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0043910 A1 | 2/2020 | Uzoh et al. |
| 2020/0058617 A1 | 2/2020 | Wu et al. |
| 2020/0075520 A1 | 3/2020 | Gao et al. |
| 2020/0075533 A1 | 3/2020 | Gao et al. |
| 2020/0075534 A1 | 3/2020 | Gao et al. |
| 2020/0075553 A1 | 3/2020 | DeLaCruz et al. |
| 2020/0118973 A1 | 4/2020 | Wang et al. |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | DeLaCruz et al. |
| 2021/0193624 A1 | 6/2021 | DeLaCruz et al. |
| 2021/0193625 A1 | 6/2021 | Katkar et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |

(56) References Cited

U.S. PATENT DOCUMENTS

| | | |
|---|---|---|
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285213 A1 | 9/2022 | Uzoh et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187398 A1 | 6/2023 | Gao et al. |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0282610 A1 | 9/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |

FOREIGN PATENT DOCUMENTS

| | | |
|---|---|---|
| EP | 2 685 491 A2 | 1/2014 |
| JP | 04-337694 | 11/1992 |
| JP | 2000-100679 | 4/2000 |
| JP | 2001-102479 | 4/2001 |
| JP | 2002-353416 A | 12/2002 |
| JP | 2004-193493 | 7/2004 |
| JP | 2009-135348 | 6/2009 |
| JP | 2010-073964 | 4/2010 |
| JP | 2013-033786 A | 2/2013 |
| JP | 2017-130610 | 7/2017 |
| JP | 2018-160519 | 10/2018 |
| KR | 10-0386954 B1 | 6/2003 |
| KR | 10-2004-0020827 | 3/2004 |
| KR | 10-2015-0097798 | 8/2015 |
| WO | WO 2005/043584 A2 | 5/2005 |
| WO | WO 2009/005898 A1 | 1/2009 |
| WO | WO 2010/024678 A1 | 3/2010 |
| WO | WO 2014/052445 A1 | 4/2014 |
| WO | WO 2015/134227 A1 | 9/2015 |
| WO | WO 2017/151442 A1 | 9/2017 |

OTHER PUBLICATIONS

Chinese Office Action dated Sep. 26, 2023 with Search Report, Chinese Application No. 201980064165.6, 8 pages.

Leissa, A.W., "Vibration of Plates," NASA SP-160, 1969, 362 pages.

Lim, K. et al., "Design and simulation of symmetric wafer-to-wafer bonding compensating a gravity effect," 2020 IEEE 70th Electronic Components and Technology Conference (ECTC), doi: 10.1109/ECTC32862.2020.00234 (2020), 6 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

ONSEMI AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, ElectronicsWeekly.com ("Bush article"); however, the imaged part and the part shown in the BUSH article share the part number "ONSEMI AR0820."

Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260."

Zgheib, Elia et al., "Multilayered models for determining the Young's modulus of thin films by means of Impulse Excitation Technique," https://www.sciencedirect.com/science/article/pii/S0167663619304752,Manuscript_68d36734cad5d1ad97e7c65bfb45f5d1, 2019, 39 pages.

Fukushima, Takafumi et al., "Oxide-oxide thermocompression direct bonding technologies with capillary self-assembly for multichip-to-wafer heterogeneous 3D system integration," Micromachines, Oct. 2016, vol. 7, No. 184, p. 18 pages.

International Search Report and Written Opinion for PCT/US2019/048736, dated Aug. 29, 2019, 13 pages.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Moriceau, H. et al., "Overview of recent direct wafer bonding advances and applications," Advances in Natural Sciences-Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(I), 6 pages.

Plobi, A. et al., "Wafer direct bonding: tailoring adhesion between brittle materials," Materials Science and Engineering Review Journal, 1999, R25, 88 pages.

Suga et al., "Bump-less interconnect for next generation system packaging," Electronic Components and Technology Conference, 2001, IEEE, pp. 1003-1008.

Suga, T., "Feasibility of surface activated bonding for ultra-fine pitch interconnection—a new concept of bump-less direct bonding for system level packaging," The University of Tokyo, Research Center for Science and Technology, 2000 Electronic Components and Technology Conference, 2000 IEEE, pp. 702-705.

"Die-to-Wafer Fusion and Hybrid Bonding," EV Group, https://www.evgroup.com/technologies/die-to-wafer-fusion-and-hybrid-bonding/, printed Sep. 21, 2022, 8 pages.

"Photo Etching DBC for Power Circuits—Direct Bond Copper (DBC) on Ceramic Used for Power Circuits," Conard Corporation, 2021, downloaded Nov. 9, 2021, https://www.conardcorp.com/photo-etching-dbc-for-power-circuits/, 2 pages.

(56) References Cited

OTHER PUBLICATIONS

"The effects of edge trimming—Engineering R&D Division, Operation V," DISCO Technical Review Mar. 2016, 3 pages.
"Lecture 29: Productivity and process yield," National Programme on Technology Enhanced Learning (NPTEL), MM5017: Electronic materials, devices, and fabrication, 16 pages.
Amirfeiz et al., "Formation of silicon structures by plasma-activated wafer bonding," Journal of The Electrochemical Society, 2000, vol. 147, No. 7, pp. 2693-2698.
Ceramic Microstructures: Control at the Atomic Level, Recent Progress in Surface Activated Bonding, 1998, pp. 385-389.
Chang, T.C. et al., "A method for fabricating a superior oxide/nitride/oxide gate stack," Electrochemical and Solid-State Letters, 2004, vol. 7, No. 7, pp. G138-G140.
Chung et al., "Room temperature GaAs—Si and InP—Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.
Chung et al., "Wafer direct bonding of compound semiconductors and silicon at room temperature by the surface activated bonding method," Applied Surface Science, Jun. 2, 1997, vols. 117-118, pp. 808-812.
Farrens et al., "Chemical free room temperature wafer to wafer direct bonding," J. Electrochem. Soc., The Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.
Frumusanu, Andrei, "TSMC's version of EMIB is 'LSI': Currently in pre-qualification," AnandTech, https://www.anandtech.com/show/16031/tsmcs-version-of-emib-Isi-3dfabric, Aug. 25, 2020, 6 pages.
Gao, G. et al., "Low temperature hybrid bonding for die to wafer stacking applications," 2021 IEEE 71st Electronic Components and Technology Conference (ECTC), IEEE, Jun. 1, 2021-Jul. 4, 2021.
Gösele et al., "Semiconductor Wafer Bonding: a flexible approach to materials combinations in microelectronics; micromechanics and optoelectronics," IEEE, 1997, pp. 23-32.
Hooper, A. et al. "Review of wafer dicing techniques for via-middle process 3DI/TSV ultrathin silicon device wafers," 2015 IEEE 65th Electronic Components and Technology Conference (ECTC).
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs—Si and InP—Si wafer direct bonding by the surface activated bonding method," Nuclear Inst. and Methods in Physics Research B, 1997, vol. 121, Nos. 1-4, pp. 203-206.
Howlader et al., "A novel method for bonding of ionic wafers," Electronics Components and Technology Conference, 2006, IEEE, p. 7-pp.
Howlader et al., "Bonding of p-Si/n-InP wafers through surface activated bonding method at room temperature," Indium Phosphide and Related Materials, 2001, IEEE International Conference on, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Jin, H. et al., "Silicon / Silicon Oxide / LPCVD Silicon Nitride Stacks: the Effect of Oxide Thickness on Bulk Damage and Surface Passivation," Centre for Sustainable Energy Systems, Faculty of Engineering and Information Technology, The Australian National University, Canberra ACT 0200, Australia, 3 pages.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—CU, Cu—Si, and Cu—SiO2 at low temperature," Proceedings—Electrochemical Society, 2003, vol. 19, pp. 239-247.
Lei, W.S. et al., "Die singulation technologies for advanced packaging: a critical review," J. Vac. Sci. Technol. B 30(4), Apr. 6, 2012, Jul./Aug. 1012, pp. 040801-1-040801-27.
Marinov, Val et al., "Laser-enabled advanced packaging of ultrathin bare dice in flexible substrates,"IEEE Transactions on Components, Packaging and Manufacturing Technology, Apr. 2012, vol. 2, No. 4, pp. 569-577.
Matsuzawa et al., "Room-temperature interconnection of electroplated Au microbump by means of surface activated bonding method," Electronic Components and Technology Conference, 2001, 51st Proceedings, IEEE, pp. 384-387.
NASA SBIR/STTR Technologies, Proposal No. 09-1 S5.05-9060—Reliable Direct Bond Copper Ceramic Packages for High Temperature Power Electronics, Contract No. NNX10CE23P, PI: Ender Savrun, PhD, Sienna Technologies, Inc.—Woodinville, WA, 1 page.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Reiche et al., "The effect of a plasma pretreatment on the Si/Si bonding behaviour," Electrochemical Society Proceedings, 1998, vol. 97-36, pp. 437-444.
Roberds et al., "Low temperature , in situ, plasma activated wafer bonding," Electrochemical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Conference, 51st Proceedings, 2001, IEEE, pp. 755-760.
Shingo et al., "Design and fabrication of an electrostatically actuated MEMS probe card," TRANDUCERS, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Surface activated bonding—an approach to joining at room temperature," Ceramic Transactions: Structural Ceramics Joining II, The American Ceramic Society, 1993, pp. 323-331.

(56) References Cited

OTHER PUBLICATIONS

Suga et al., "Surface activated bonding for new flip chip and bumpless interconnect systems," Electronic Components and Technology Conference, 2002, IEEE, pp. 105-111.

Suga, "UHV room temperature joining by the surface activated bonding method," Advances in science and technology, Techna, Faenza, Italie, 1999, pp. C1079-C1089.

Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.

Takagi et al., "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.

Takagi et al., "Effect of surface roughness on room-temperature wafer bonding by Ar surface activation," Japanese Journal of Applied Physics, 1998, vol. 37, Part 1, No. 1, pp. 4197.

Takagi et al., "Low temperature direct bonding of silicon and silicon dioxide by the surface activation method," Solid State Sensors and Actuators, 1997, TRANSDUCERS '97 Chicago, 1997 International Conference, vol. 1, pp. 657-660.

Takagi et al., "Room temperature silicon wafer direct bonding in vacuum by Ar beam irradiation," Micro Electro Mechanical Systems, MEMS '97 Proceedings, 1997, IEEE, pp. 191-196.

Takagi et al., "Room-temperature bonding of lithium niobate and silicon wafers by argon-beam surface activation," Appl. Phys. Lett., 1999. vol. 74, pp. 2387.

Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.

Takagi et al., "Room-temperature wafer bonding of silicon and lithium niobate by means of arbon-beam surface activation," Integrated Ferroelectrics: an International Journal, 2002, vol. 50, Issue 1, pp. 53-59.

Takagi et al., "Surface activated bonding silicon wafers at room temperature," Appl. Phys. Lett. 68, 2222 (1996).

Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.

Tong et al., "Low temperature wafer direct bonding," Journal of Microelectomechanical systems, Mar. 1994, vol. 3, No. 1, pp. 29-35.

Topol et al., "Enabling technologies for wafer-level bonding of 3D MEMS and integrated circuit structures," 2004 Electronics Components and Technology Conference, 2004 IEEE, pp. 931-938.

Uhrmann, T. et al., "Heterogeneous integration by collective die-to-wafer bonding," Chip Scale Review, Nov./Dec. 2018, vol. 22, No. 6, pp. 10-12.

Urteaga, M. et al., "THz bandwidth InP HBT technologies and heterogeneous integration with Si CMOS," 2016 IEEE Bipolar/BiCMOS Circuits and Technology Meeting (BCTM), 2016, pp. 35-41, doi: 10.1109/BCTM.2016.7738973.

Wang et al., "Reliability and microstructure of Au—Al and Au—Cu direct bonding fabricated by the Surface Activated Bonding," Electronic Components and Technology Conference, 2002, IEEE, pp. 915-919.

Wang et al., "Reliability of Au bump—Cu direct interconnections fabricated by means of surface activated bonding method," Microelectronics Reliability, May 2003, vol. 43, Issue 5, pp. 751-756.

Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.

Xu et al., "New Au—Al interconnect technology and its reliability by surface activated bonding," Electronic Packaging Technology Proceedings, Oct. 28-30, 2003, Shanghai, China, pp. 479-483.

\* cited by examiner

BOND ENHANCEMENT STRUCTURE IN MICROELECTRONICS FOR TRAPPING CONTAMINANTS DURING DIRECT-BONDING PROCESSES

RELATED APPLICATIONS

This application is a continuation of U.S. application Ser. No. 16/553,535, filed Aug. 28, 2019, which claims the benefit of priority to U.S. Provisional Patent No. 62/724,270 to Gao et al., filed on Aug. 29, 2018, the disclosures of which are expressly incorporated by reference herein in their entirety.

BACKGROUND

FIG. 1 shows conventional pitfalls that occur while forming bonds during direct-bonding processes used in microelectronics fabrication and packaging. Nonbonding areas called bonding voids or just "voids" can occur in the bonding interface between two surfaces being joined, and these voids can weaken the direct bond being formed.

Direct-bonding processes take place between two nonmetal, dielectric surfaces, or may take place between two surfaces that also have metal pads or conductive features to be bonded together, for making an electrical interconnect, for example. When metal or conductive features are also present in the bonding interface, the bonding process may be called direct hybrid bonding.

The detrimental voids in the bonding interface may occur due to lack of a buffer area in the interface to make space for stray particles and other undesirable byproducts of the direct-bonding processes. With nowhere else to go, the stray particles stay between the surfaces being joined causing random voids in the bond. Some stray particles, foreign materials, and other imperfections have a tendency to create relatively large voids between the surfaces being bonded. In direct bond interconnect (DBI®) hybrid bonding processes (available from Invensas Bonding Technologies, Inc., formerly Ziptronix, Inc., an Xperi Corporation company, San Jose, CA), these concerns are magnified because the undesirable voids can occur on electrical leads that are only a few hundred nanometers or even a few tens of nanometers in width. High performance is often required of such ultrafine electrical leads. High bandwidth memory, such as HBM2 memory, for example, may demand signal speeds up to 2.4 Gbps per pin or even higher speeds, and SerDes signaling may need to pass through a bonded interface at 112 Gbps, for example.

In FIG. 1, when undesirable voids 10 have been created in a conventional direct-bonding interface 20, a given void 10 may intervene within the footprint (cross-sectional bond area) 30 of the electrical interconnect being bonded, and the particle itself 40 may also intervene. The void 10 effectively insulates a part of the cross-sectional footprint 30 of the interconnect from carrying the electrical current it would have carried, if bonded. The voids 10 thereby cause compromised input-output (10) connections and a marked decrease in overall assembly yield and/or reliability of the device being created.

Such voids 10 have been observed in direct-bonding of silicon wafers that have only a thin layer of native oxide. Because crystalline silicon does not have enough defect sites to capture gas contamination during an annealing step, the formation of voids results from gaseous byproducts. Similarly, when one of the surfaces being bonded is a silicon nitride, the nitride layer is impermeable to the escape of water vapor, hydrogen gas, and other reactant byproducts through diffusion, resulting in formation of the voids 10 during the annealing step. A poor-quality oxide surface that contains residual components from the oxide deposition process may also result in outgassing, and subsequent formation of voids 10 at the bonded interface. Apart from gases that are released during the annealing step, particles and other contaminants on the surfaces prior to bonding, that were not removed during the cleaning processes or that were deposited even after the cleaning processes, also lead to the formation of voids 10.

In addition, the edges of the surfaces 20 being bonded may have chipping 50, micro-fractures 60, and residue that are present from being diced or sawn along the edges. These likewise create bonding voids 10, that may weaken the bond between surfaces being joined, even when they do not interfere with electrical conduction of an interconnect.

The tendency of small particles or defects 40 to create voids 10 during bonding is accentuated in microelectronic fabrication processes by the bonding surfaces typically being ultra-flat, after flattening processes such as chemical-mechanical planarization (CMP). Because the bonding surfaces are so flat, a small particle 40 (for example, one micron in diameter) may cause a bonding void of three to ten microns or larger in diameter.

SUMMARY

Structures and techniques provide bond enhancement in microelectronics by trapping contaminants and defect-producing byproducts during bonding processes and arresting the propagation of cracks. Example surfaces for direct-bonding are provided with predesigned recesses, sinks, traps, trenches, or cavities (hereinafter "recesses") to capture small particles and gaseous byproducts of bonding that would otherwise create detrimental voids between microscale surfaces being joined. The recesses can also prevent cracks, fissures, and delamination processes from propagating along a surface or across a layer. Such random voids are detrimental and can compromise both bond integrity and electrical conductivity of interconnects being bonded.

In example systems, a predesigned recess space or pre-designed pattern of recesses placed in the bonding interface captures particles and gases, reducing the formation of detrimental random voids, thereby improving and protecting the bond as it forms. The recess space or pattern of recesses may be placed where particles collect (defect sink) on the bonding surface, through example methods of determining where mobilized particles move during bond wave propagation. A recess may be repeated in a stepped reticle pattern at the wafer level, for example, or placed by an aligner or alignment process. The recess in some examples may be less than 20 nm in width and may be nonoperational such that the particles or contaminants do not come in contact with operational components or circuitry.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DETAILED DESCRIPTION

Overview

This disclosure describes bond enhancement in microelectronics by trapping contaminants and arresting cracks during direct-bonding processes. Example surface structures and confinement techniques provide bond enhancement for fabrication of microelectronic components by capturing and sequestering particles, contaminants, and gaseous byproducts in predesigned recesses in the bonding surface during direct-bonding processes, and by arresting the propagation of cracks, chipping, and delamination processes. Direct-bonding processes may comprise dielectric-to-dielectric bonding between nonmetals, or may be direct hybrid bonding that also includes metal-to-metal or conductive layer-to-conductive layer bonding at the bonding interface.

In example systems, bonding surfaces that have been planarized to a high degree of flatness are provided with recesses, sinks, traps, or cavities at predetermined places to capture small particles, gaseous byproducts of bonding, contaminants or some other undesirable defects that can create relatively undesirable voids between the two surfaces being joined. Example recesses may be manufactured into a die or wafer during fabrication, at locations where particles collect when the particles move during bond wave propagation, during the direct-bonding. The recesses may also be generated in arrays, patterns, or bands at predetermined locations by etching a surface to be bonded. Recesses may be repeated in a stepped reticle pattern at the wafer level, for example, or may be placed by an aligner or alignment process.

Example Systems and Techniques

Figure 1:
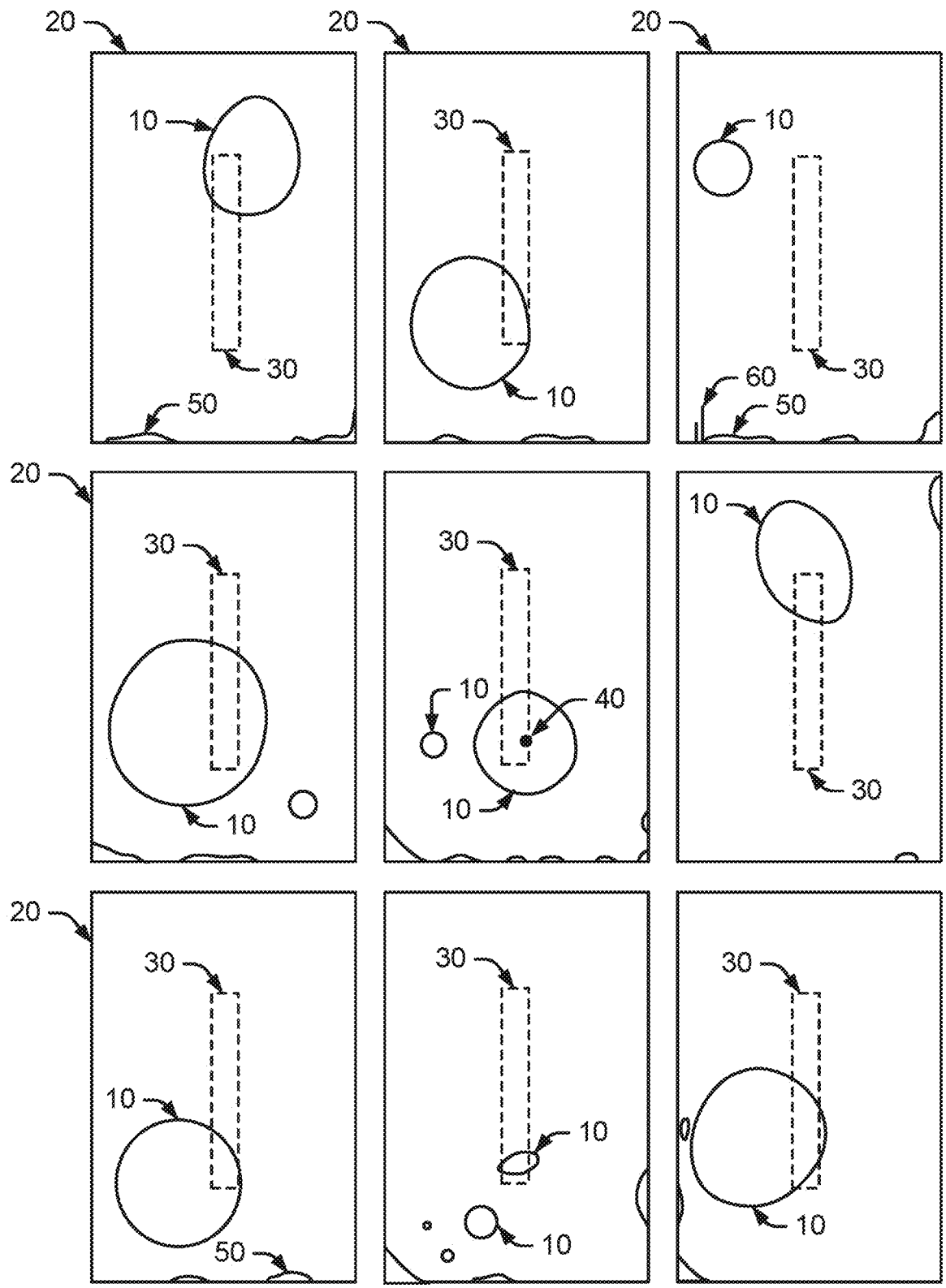
FIG. 1 is a diagram of conventional bonding voids, and their deleterious effect on bond integrity and electrical performance of direct-bonded interconnects.
Figure 2:
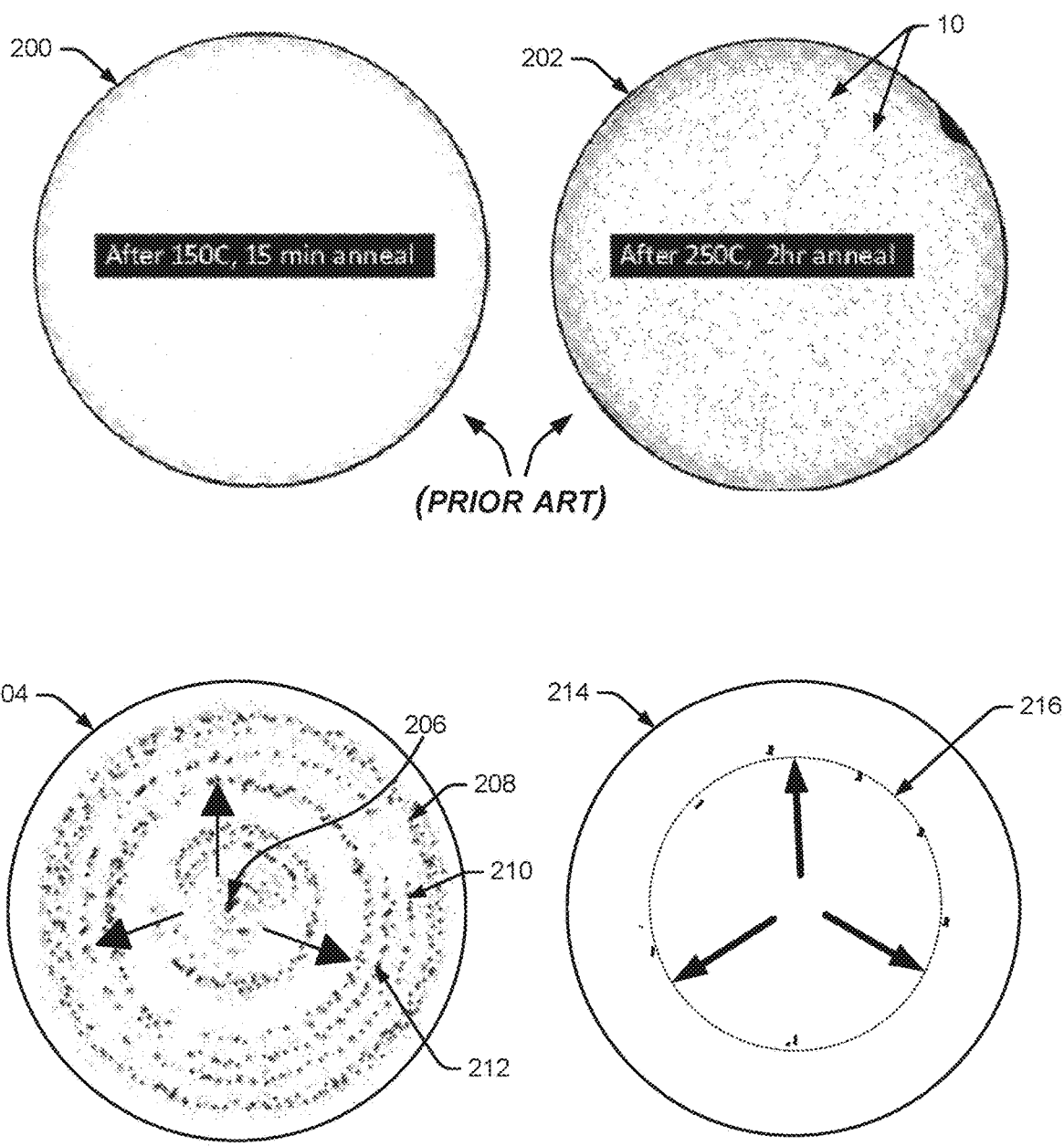
FIG. 2 is a diagram showing various bonding and annealing scenarios, demonstrating how contaminants affect direct-bonding and example recesses to capture the contaminants.

FIG. 2 shows various bonding and annealing scenarios, demonstrating how contaminants affect direct-bonding. In a first example, silicon wafers with native oxide are processed and then bonded in a room temperature direct-bonding process. In scenario 200, after 15 minutes at an annealing temperature of 150° C., voids are not discernible, or are barely discernible by techniques such as confocal scanning acoustic microscopy (CSAM). In scenario 202, after 2 hours at an annealing temperature of 250° C., numerous voids 10 are clearly visible on the CSAM image. The voids 10 may be the results of localized debonding caused by gaseous byproducts such as water, hydrogen molecules, or an unknown material. The reactant byproducts may be generated and voids formed due to the dielectrics on silicon wafer, e.g., silicon oxide, silicon nitride, silicon carbonitride, silicon oxynitride, etc. For example, low temperature oxide deposited via silane and TEOS processes can generate more reactant byproducts than silicon alone, which lead to generating voids during the bonding process. These voids may grow further during annealing at higher temperature. When void propagation is not prevented or checked, debonding and delamination can sometimes spread across the bonded surfaces.

Scenario 204 shows movement of contaminant particles during direct-bonding. It has been discovered that certain direct-bonding processes cause contaminants, such as particles on the bonding surface, to move during bond wave propagation, as shown in scenario 204. When a pair of wafers with numerous small particles on the bonding surface are bonded together with the bonding initiated at the wafer center 206, the particles become mobile and are moved outward along the propagating bonding wave and then deposited by these forces in rings, for example rings 208 & 210 & 212 on the wafer. In scenario 214, when a pair of wafers with much fewer particles is bonded together, the particles also move and come to rest in a ring or rings along the bonding wave, although in fewer numbers. One or more example predesigned recesses 216 may be placed at or near each ring of maximum particle concentration to trap these particles or undesirable defects.

Example systems determine locations where mobilized particles collect, and then place one or more predesigned recesses 216 next to the critical bonding areas as sinks or traps to collect and store the particles to prevent formation of bonding voids 10 in these critical areas.

Figure 3:
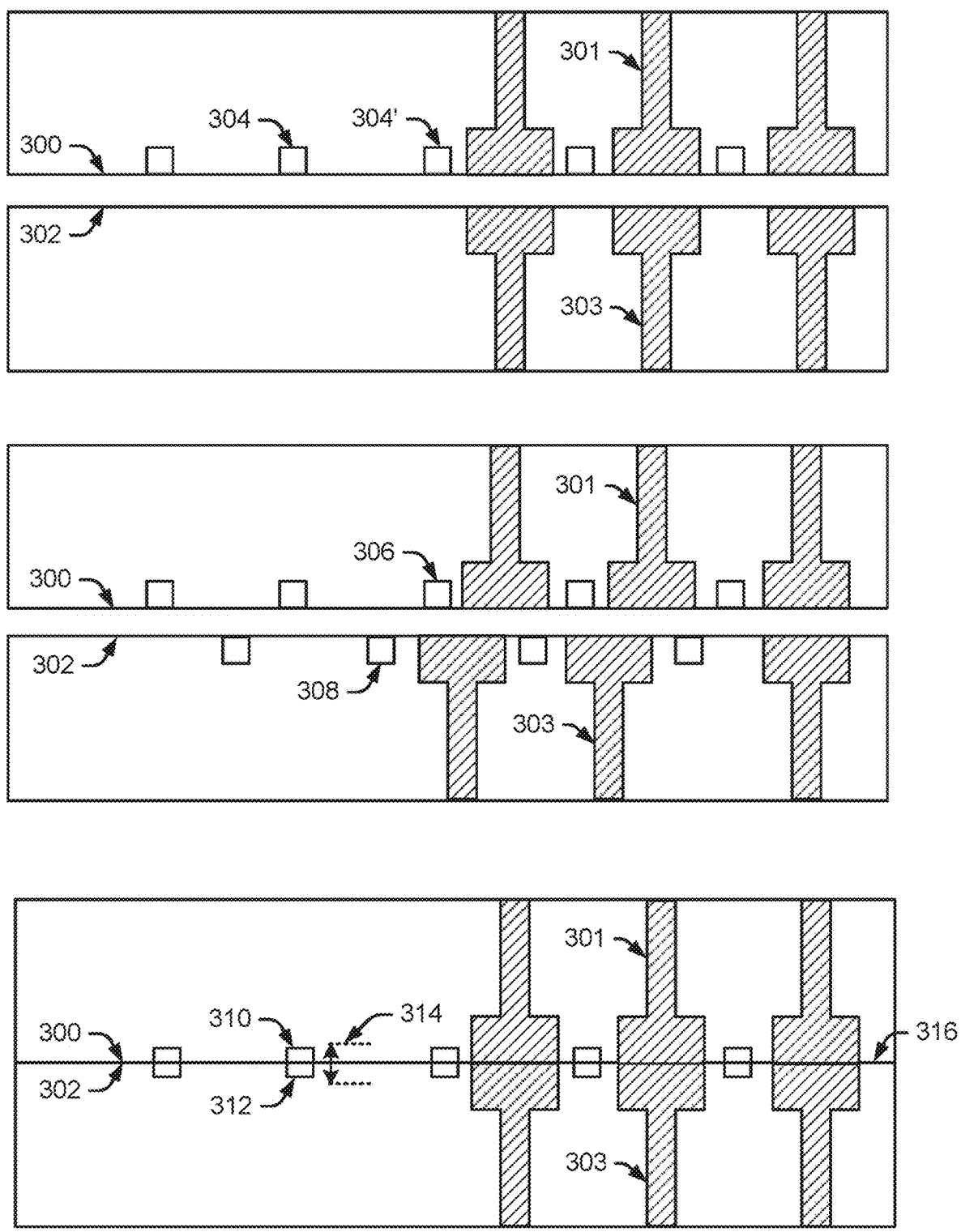
FIG. 3 is a diagram showing example techniques for alleviating undesirable voids (voids not shown) and improving bond strength and integrity in manufacture of microelectronic packages.

FIG. 3 shows example techniques for alleviating undesirable voids (voids not shown) and improving bond strength and integrity in manufacture of microelectronic packages.

In an implementation, a microelectronic component presents a first bonding surface 300. A second bonding surface 302 is suitable for bonding with the first bonding surface 300. Both surfaces are typically ultra-flat after CMP for direct-bonding or direct hybrid bonding. The two surfaces 300 & 302 may be surfaces of a first die and a second die in a D2D package construction, or a die and a wafer in D2W package construction, or may both be wafer surfaces in a W2W process, for example. In direct dielectric-to-dielectric bonding, the two surfaces 300 & 302 may be nonmetals, such as inorganic dielectric materials, such as stoichiometric or nonstoichiometric silicon oxide, for example. In direct hybrid bonding the two surfaces 300 & 302 may include both dielectrics and conductive materials for example metal conductors 301 & 303, such as pads, vias, trenches, MEMS membranes, pins, leads, and connectors to be joined across the bonding interface.

In an implementation, the first bonding surface 300 is provided with predesigned recesses 304 & 304' to capture at least one substance detrimental to the bond between the first bonding surface 300 and the second bonding surface 302. The planar dimension of the predesigned recess 304 can range from submicron in extent to tens or hundreds of microns. The depths of each predesigned recess 304 can vary from a few nanometers to several microns. Oxide-to-oxide direct-bonding, or other types of dielectric bonding, may release water vapor, hydrogen gas, and unknown materials, for example. Chemical vapor deposited (CVD) oxides (for example, some nonstoichiometric oxides) may also outgas during an annealing phase, as shown in scenario 202 of FIG. 2.

Sometimes, if the dielectric layer being bonded has enough inherent defects, the gaseous byproducts are sinked innately, and detrimental voids 10 that could form randomly during an annealing step do not occur. Design of bonding surfaces 300 & 302 may include providing materials for the surfaces 300 & 302 that have inherent recesses with dimensions calculated to capture particles or other contaminants of the direct-bonding process at hand. Various schemes may be applied to create or provide surfaces 300 & 302 with a calculated degree of porosity, for example. If the dielectric layer does not have enough inherent spaces or pores to trap at least gases, then the gas molecules tend to aggregate in random locations to cause formation of the detrimental voids 10 during annealing or subsequent higher temperature processing. In contrast to the randomly formed bonding voids 10 which negatively affect electrical performance of the parts, the predesigned recess areas 304 & 304' in designated places do not impact electrical performance adversely, but may improve the bond. In some cases predesigned recess 304 & 304' can even enhance electrical performance.

Spacing between example recesses 304 & 304' can be configured to relate to the relative cleanliness of the bonding process, the type of materials being bonded, and to the type of contaminants and bonding byproducts being generated by the bonding step or annealing step. If there is little debris and only a low level of byproducts, then the recesses 304 & 304' may be smaller, and/or spaced further apart. (The recesses 304 shown in FIG. 3 are not to scale.) For example, conductive leads 301 & 303 to be bonded together may only be a few microns in width, and the recesses 304 imparted by etching, for example, may be even smaller, or may be larger.

The recesses 304 may be provided on only one surface 300. Or, recesses 306 & 308 may also be provided on both surfaces 300 & 302, with random alignment of the recesses 306 & 308 with respect to each other across the bonding interface.

Recesses 310 & 312 may be provided on both surfaces 300 & 302 and aligned with each other, so that each recess 310 & 312 forms half or some other fractional part of a resulting final recess 314 at the bonded interface 316. Aligning the recesses 310 & 312 with each other minimizes the unbonded surface area between the first bonding surface 300 and the second bonding surface 302.

Although the recesses 304 & 306 & 308 & 310 & 312 shown in FIG. 3 all appear to be of similar depth and width, they may have different depths, different widths, as well as different shapes. For example, recesses 304 & 304' formed on the same surface 300 may have different shape, depth, and/or width. In another example, recesses 306 and 308 formed on different surfaces 300 and 302 may have different shapes, depths, and/or widths. Also, a single recess may have multiple depths.

Figure 4:
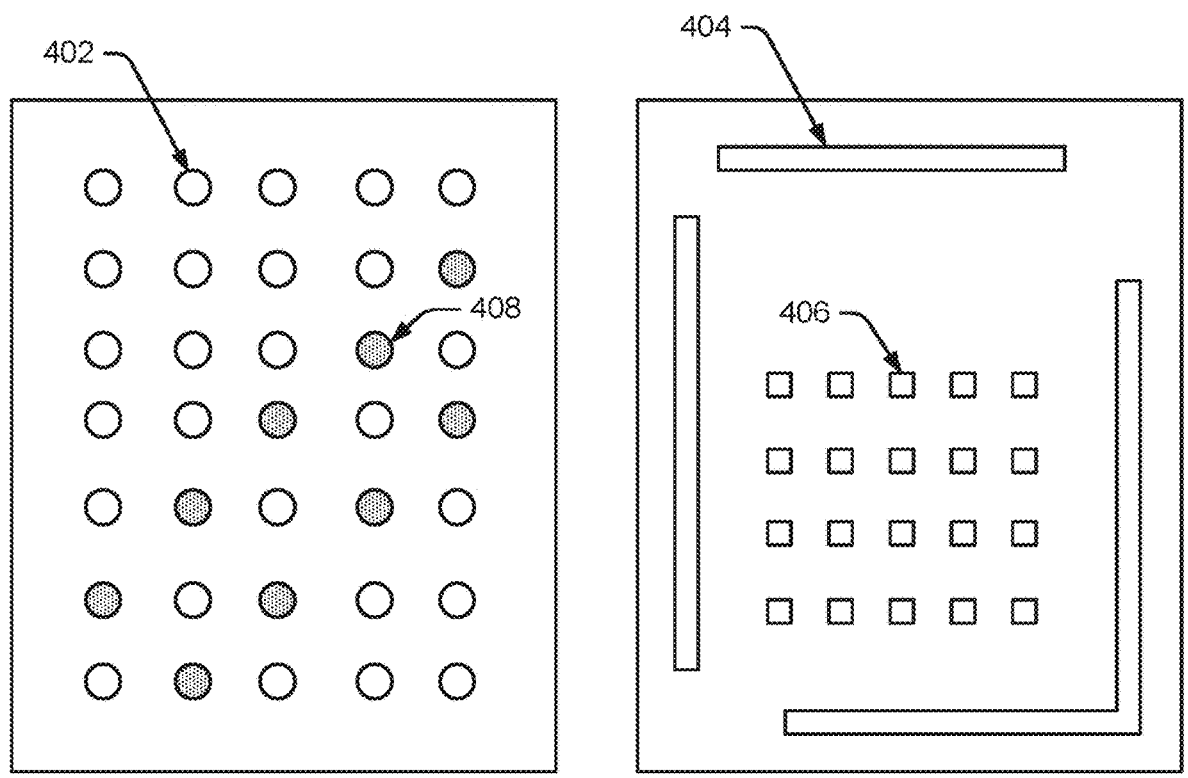
FIG. 4 is a diagram of example patterns and arrays of recesses provided in bonding surfaces.
Figure 4:
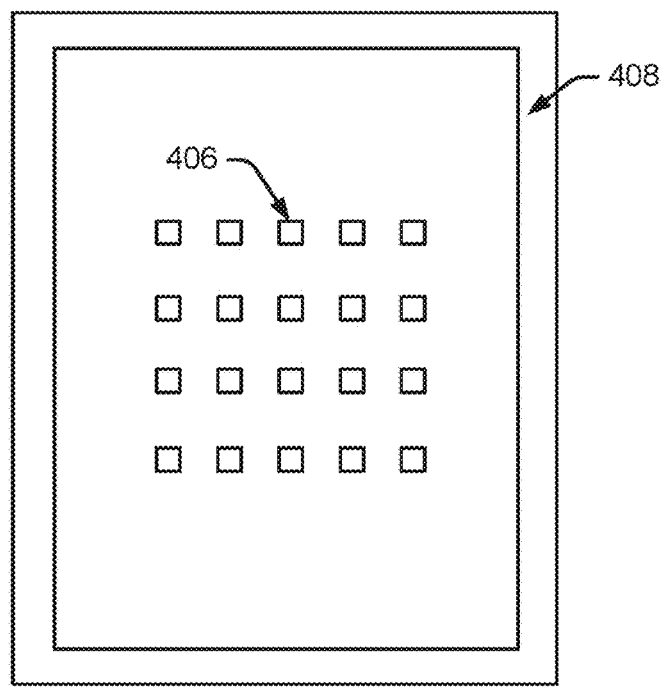

In FIG. 4, the predesigned recesses 402 & 404 & 406 & 408 (not to scale) of different shapes may be traps, sinks, cavities, indents, cups, or dished surfaces to be used for capturing contaminants. The predesigned recesses 402 & 404 & 406 & 408 may be arrayed or patterned to fit the specific direct-bonding process used and the type of materials being bonded. Predesigned recesses 402 & 404 & 406 & 408 are placed to make the bonding areas around them stronger with more consistent bonds. But since the recesses 402 & 404 & 406 & 408 themselves take up some of the bonding area, the minimum number of recesses 402 & 404 & 406 & 408 needed to immunize the bonding areas from contaminants may be calculated ahead of time, or may be determined before placement through an experimental run, for the particular circumstances of the specific direct-bonding process and materials. The sizes and spacing of predetermined recesses 402 & 404 & 406 & 408 may be customized to best capture particulate contaminants of one size, or bonding reaction byproducts of another size or type, or byproducts of an annealing step. Or, the sizes and spacing of predetermined recesses 402 & 404 & 406 & 408 may be customized for all, or averaged in view of all types of contaminants from all sources. In another example, a recess that has any shape may also include surface texturing to create nanopores or micropores on the surface of the recess. For example, porous silicon or porous silicon oxide or porous dielectric may use this scheme.

In an implementation, a coating or deposition of palladium metal 408 or other hydride-forming metal (for example tantalum, titanium, etc.) may be added to the predesigned recesses to absorb hydrogen gas byproducts. Palladium, as used in microelectronics can absorb up to 900 times its own volume in hydrogen. Also, besides depositing palladium or a hydride-forming metal, any other metal or dielectric that can absorb and/or occlude reaction byproduct gases, moisture or a contaminant may also be deposited in the one or more predesigned recesses 402, 404, 406, 408. For example, one or more recesses may also be deposited with getter materials. Different getter materials can have different properties. For example, aluminum (Al) can have a getter capacity of about 1 Pa-l/mg against oxygen ($O_2$). Barium (Ba) can have a getter capacity of about 0.69 Pa-l/mg against carbon dioxide ($CO_2$), about 11.5 Pa-l/mg against hydrogen ($H_2$), and about 2 Pa-l/mg against ($O_2$). Titanium (Ti) can have about 4.4 Pa-l/mg against ($O_2$). Thus, in some embodiments, the deposited material can be selected based on the types of gases that are likely to be present in the environment in which the bonded structure will be used.

In an implementation, a distributed pattern or array of recesses 402 & 404 & 406 & 408 may have first recesses 404 sized and spaced from each other for trapping fine particle contaminants, and second recesses 406 sized and spaced from each other for trapping a reaction byproduct, such as a gas, from a direct-bonding or annealing step. The recess 408 may run along the entire outer perimeter of the die. A contaminant to be captured may be a gaseous byproduct of an oxide-to-oxide direct-bonding process, a gaseous byproduct of a hybrid direct-bonding process, a gaseous byproduct of a bonding processes involving a chemical vapor deposition (CVD) oxide, a gaseous byproduct of a bonding processes involving a thermal oxide (TOX) silicon wafer or die, a gaseous byproduct of a bonding processes involving a silicon nitride surface, or a gaseous byproduct of a silicon-to-silicon direct-bonding process, for example.

Figure 5:
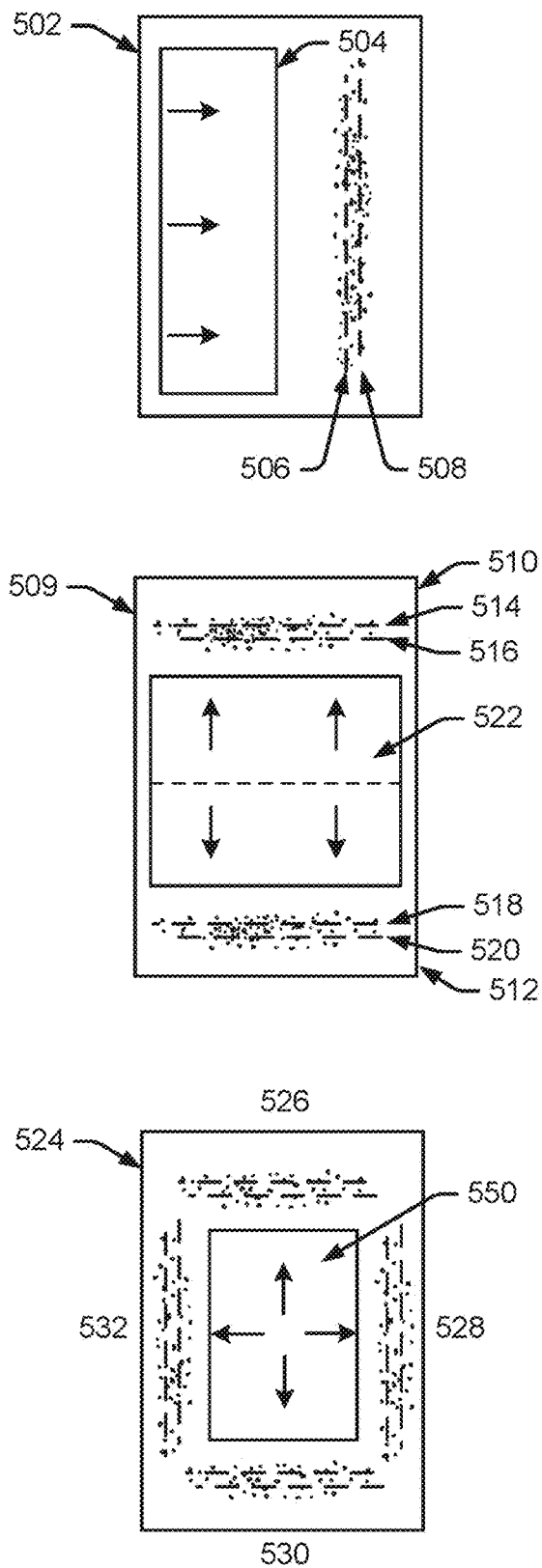
FIG. 5 is a diagram showing particle movement during bonding wave propagation, and placement of predesigned surface recesses in areas of maximum particle distribution.

FIG. 5 shows various example bonding wave patterns that occur during direct-bonding, and predesigned recesses in response to the bonding wave patterns. Various bonding waves have been found to mobilize particles and sweep the particles into characteristic patterns or resting places on bonding surfaces during direct-bonding.

In one scenario, at example bonding interface 502, propagation of the bonding wave front proceeds from one side to the other of an active bonding area 504 and sweeps the contaminants off their original positions in the direction of the propagating bonding wave front. The bonding interface 502 may be used in an example die-to-wafer (D2W) process using a porous bond head with left-edge-first contact that creates transverse bonding wave propagation, with moving particles distributed to a right side position. Predesigned traps, such as lines 506 & 508 of recessed areas can be placed at or near right angles to the direction of bonding wave propagation to collect the particles, for example near the active bonding area 504. The lines 506 and 508 of recessed areas can be placed such that the series of recesses in line 508 coincides with the series of openings of the recesses in lines 506 so that the contaminants not trapped in the line 506 of recesses move further in the direction of bonding wave propagation and are trapped in the line 508 of recesses. In the example D2W process, one or more linear bands of the recesses 506 & 508 can be placed at the locations of maximum particle distribution on the right side, for example.

In one technique, the recessed areas 506 & 508 can be allocated near bonding initiation locations to avoid contamination of the active bonding area 504 from the outset. When an active bonding area 504 is near the end of bonding wave propagation, then large traps 506 & 508 can be placed ahead of the active bonding area 504 to collect contaminants swept from other areas. These placement techniques can be useful in die-to-wafer (D2W) and die-to-die (D2D) direct-bonding processes. Some placements of the recesses 506 & 508 are useful for wafer-to-wafer (W2W) processes too.

At example bonding interface 509, propagation of the bonding wave front proceeds from a center line and proceeds to two sides 510 & 512, sweeping the contaminants off their original positions and in the direction of the propagating bonding wave fronts. For example, the lines of recessed areas 516/518 and 514/520 are placed such that the series of recesses in lines 514/520 coincides with the series of openings of the recesses in lines 516/518 so that the contaminants not trapped in the recesses of lines 516/518 move further in the direction of bonding wave propagation and are trapped in the recesses of lines 514/520. The bonding interface 509 may be used in an example D2W process using a curved bond head for the center-line-first contact moving to top and bottom edges, with the moving particles directed to the top side 510 and bottom side 512. Predesigned traps, such as recessed lines 514 & 516 and 518 & 520 can be placed at right angles to the direction of bonding wave propagations to collect the particles, for example near the active bonding area 522. The one or more linear bands of the recesses 514 & 516 and 518 & 520 can be placed at the top location 510 and bottom location 512 where maximum particle distribution occurs, for example.

At example bonding interface 524, propagation of the bonding wave front proceeds from a center point and proceeds outward to four sides 526 & 528 & 530 & 532, sweeping the contaminants off their original positions and in the direction of the propagating bonding wave fronts. Predesigned traps, such as recessed lines or arrays 534 & 536, 538 & 540, 542 & 544, and 546 & 548 can be placed at right angles to the direction of bonding wave propagations to collect the particles, for example near the active bonding area 550. Concentric rings, lines, or bands of the recesses can be placed near the peripheries where maximum particle distribution occurs, for example.

In an example center-first W2W process, direct-bonding may move particles to a particular ring (e.g., 216 in FIG. 2) which may be centrally or peripherally located on the wafer. The recesses for capturing particulate contaminants may be located or concentrated in this ring area.

The various predesigned recesses in FIG. 5 may be etched grooves or may be sink holes created in the bonding surfaces to trap the particle movement during direct-bonding to protect critical areas from contaminants and detrimental bonding voids. Although, we have shown all the recessed lines or arrays to be outside the bonding area in FIG. 5, they may also be present within the bond area. This may be done to trap the contaminants that may not be displaced to longer distances by the propagating bond wave front.

Figure 6:
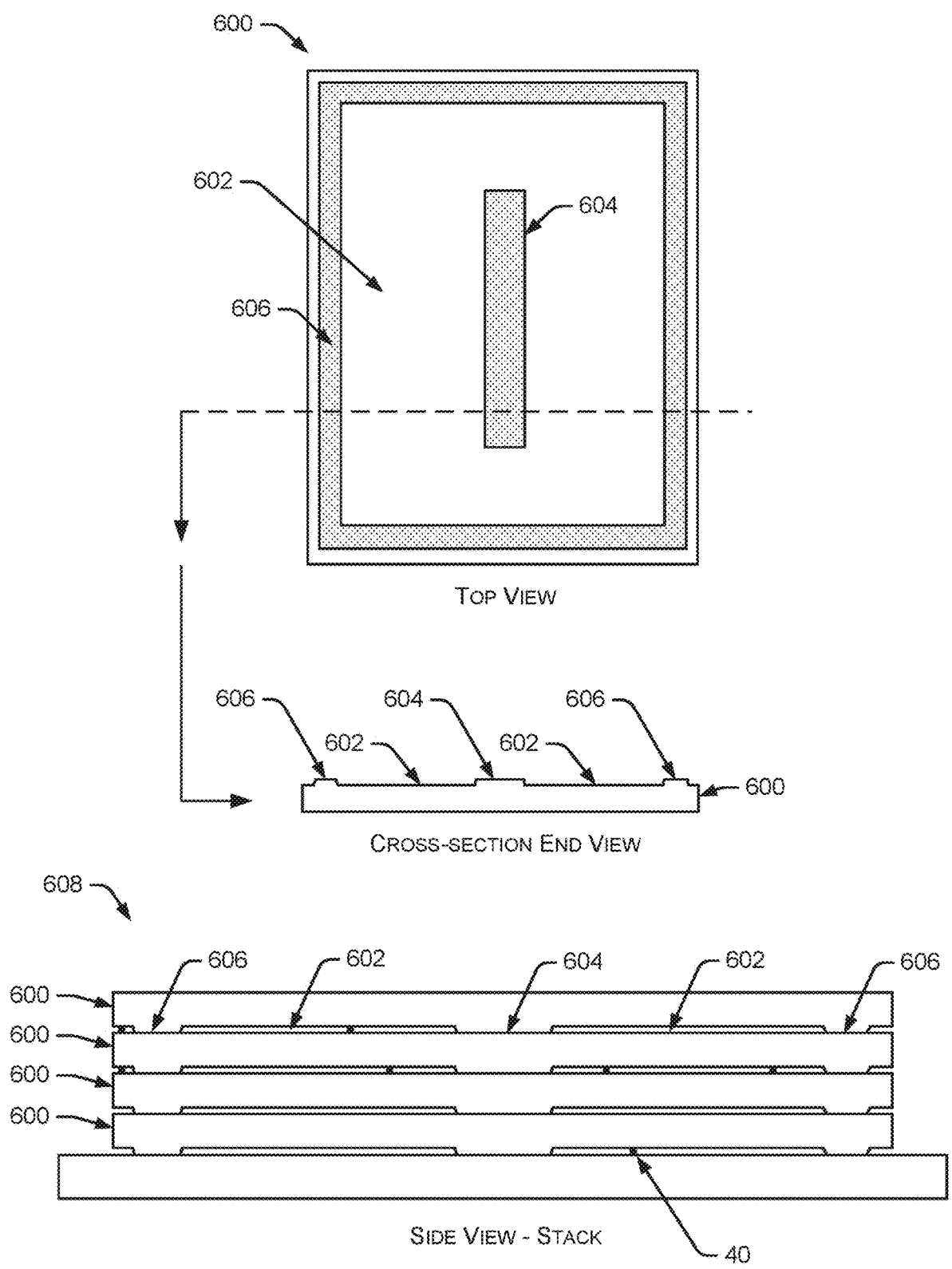
FIG. 6 is a diagram of an example bonding surface with a large non-bonding area, or recess, for capturing contaminants.

FIG. 6 shows an example bonding surface 600 configured with a large area recess 602 (also referred to as a non-bonding area 602) for particle capture, to protect bond integrity of adjacent bonding areas 604 & 606. Bonding with another surface occurs in a bonding footprint area 604, which may off-put contaminants, particles, and byproducts of the bonding reaction to the large area recess 602, which then stores, binds, or sequesters them there. Particles in the large area recess 602 up to a certain size fit into the recess 602 and do not cause delamination in the bonded area 604.

In an implementation, the large area recess 602 completely surrounds the bonding footprint 604. In an implementation, another peripheral bonding area 606 may surround the large area recess 602 as part of the overall bonding area between the two surfaces that are being joined on either side of the bonding interface. The large area recess 602 can also capture particles and contaminants from the bonding reactions and/or annealing steps of the peripheral bonding area 606.

Multiple instances of the bonding surface 600 of a die or wafer can be bonded together in a stack 608. The recesses 602 for any one bonding interface can be additive when both sides of a bonding interface have recesses 602 that align. Or, the recess 602 of one bonding surface can capture contaminants for both bonding surfaces, even when one of the bonding surfaces is flat, without any recesses.

Figure 7:
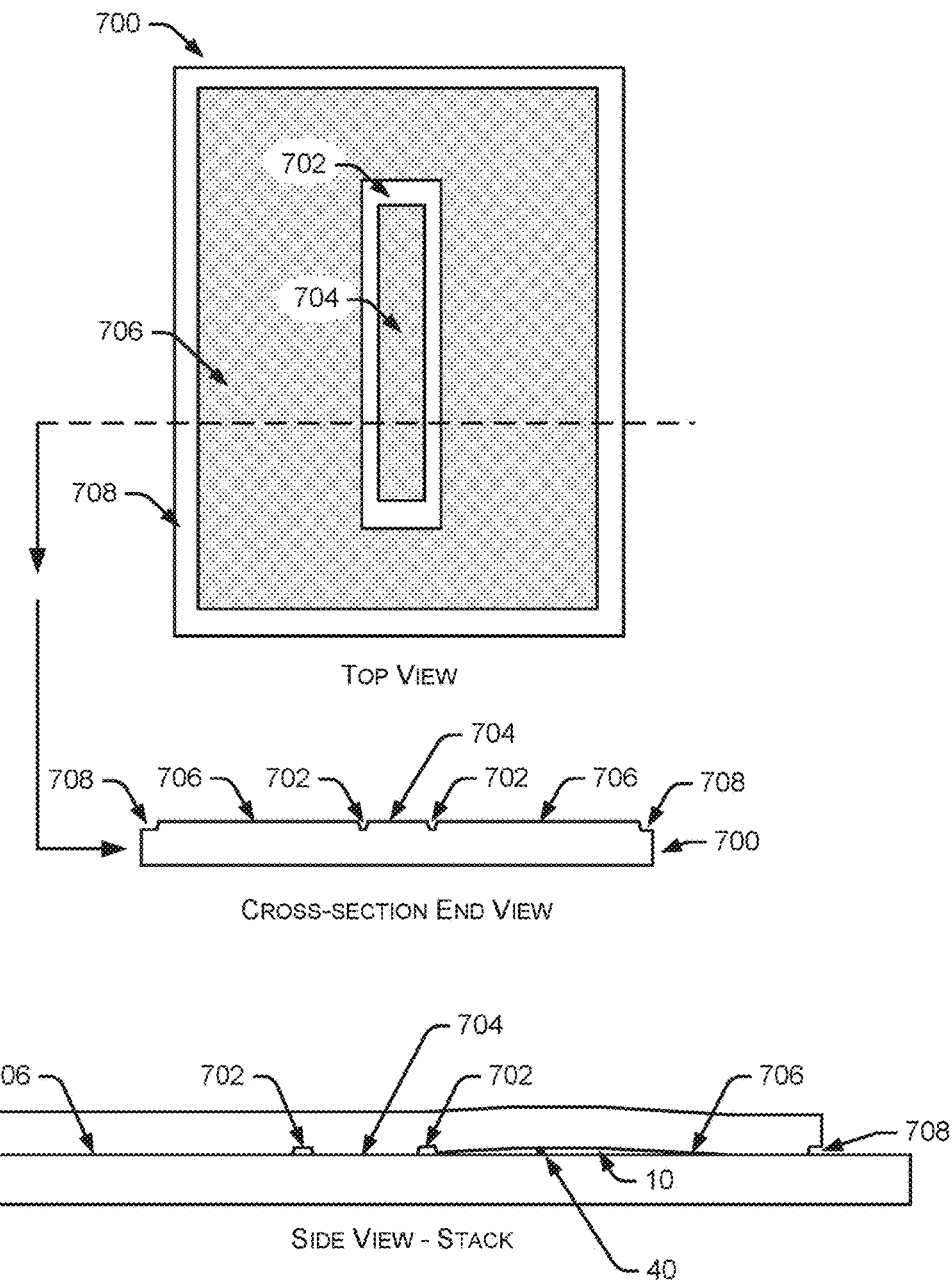
FIG. 7 is a diagram of an example bonding surface with recesses added to the surface to arrest propagation of bonding voids.

FIG. 7 shows an example bonding surface 700 that uses narrower recesses 702 & 708 for collecting contaminants from around bonding areas 704 & 706. This configuration may be especially applicable to thin and flexible semiconductor dies. Given that dies and wafers have an ultra-flat surface from CMP planarization, an offending particle 40 may also be very flat from the CMP process itself but can still create a large void between the bonded surfaces. Observational data suggest that a one micron particle in a horizontal X-Y dimension, with even lesser vertical height than one micron, may create a ten micron void or an even larger void in the interface between bonded surfaces 700.

In FIG. 7, the relatively narrow recesses 702 have a purpose of providing the bonding interface with maximum bonding area for mechanical strength. Narrow recesses 702 surrounding a bonding area 704 can arrest the propagation of delaminating forces between surfaces bonded together as well as capture contaminants detrimental to direct-bonding. The narrow recesses 702 relieve stress forces that propagate delamination, whether caused by a particle 40 within the bond interface or not. Although recess 702 is shown completely surrounding bond area 704 in FIG. 7, in another implementation, recess 702 may only partially surround bond area 704.

In an implementation, narrow encompassing recess 702 forms a moat around bonding area 704, that prevents void propagation or a delaminating process from intruding into the bonding area 704 from outside the bonding area 704. Although, only one encompassing recess 702 is shown in FIG. 7, multiple recesses 702, partially or completely surrounding the bonding area 704, may be used, circumscribing each other with bands of bonding area between them, or in other configurations wherein each of the multiple recesses 702 partially surrounds at least a central bonding area 704. A pattern of other recesses (not shown) may also be deployed in the large bonding area 706, to relieve the stress forces that would lead to delamination of the surfaces from each other in the large bonding area 706. Placement of periodic recesses at intervals to relieve such stresses has an effect analogously similar to drilling a hole at the end of a crack in a material, to arrest the cracking process, or like adding aggregate rocks to cement to form concrete, in which propagation of a crack in the concrete is internally arrested when the crack meets a rock component of the concrete, which disperses the crack energy.

Likewise, a peripheral recess 708 prevents delamination from originating at the edges of the bonding surface 700, where the die has been sawn or diced, and where contaminant particles are likely to have collected. The ratio of the bonded surface 704 & 706 to recessed non-bonding surface areas 702 & 708 can vary, and can be any ratio between what is illustrated in FIG. 6 and what is illustrated in FIG. 7, for example. In one embodiment, depending of the layout of the conductive material or pad, the width of the recess 702 is less than the width of the bonded region 704, 706. For example the ratio of a width of the recess 702 is less than 25% of a width of the bonded region 704 or 706, and this ratio may be less than 5% in other applications.

The recessed areas 702 in a stack 710 formed by two or more bonded dies or wafers, can arrest the stress forces caused by a particle 40 and the resulting delamination 10. Such stresses can also be arrested and relieved by a recessed area 702, when the recessed area 702 is present in only one of the two surfaces being bonded.

Figure 8:
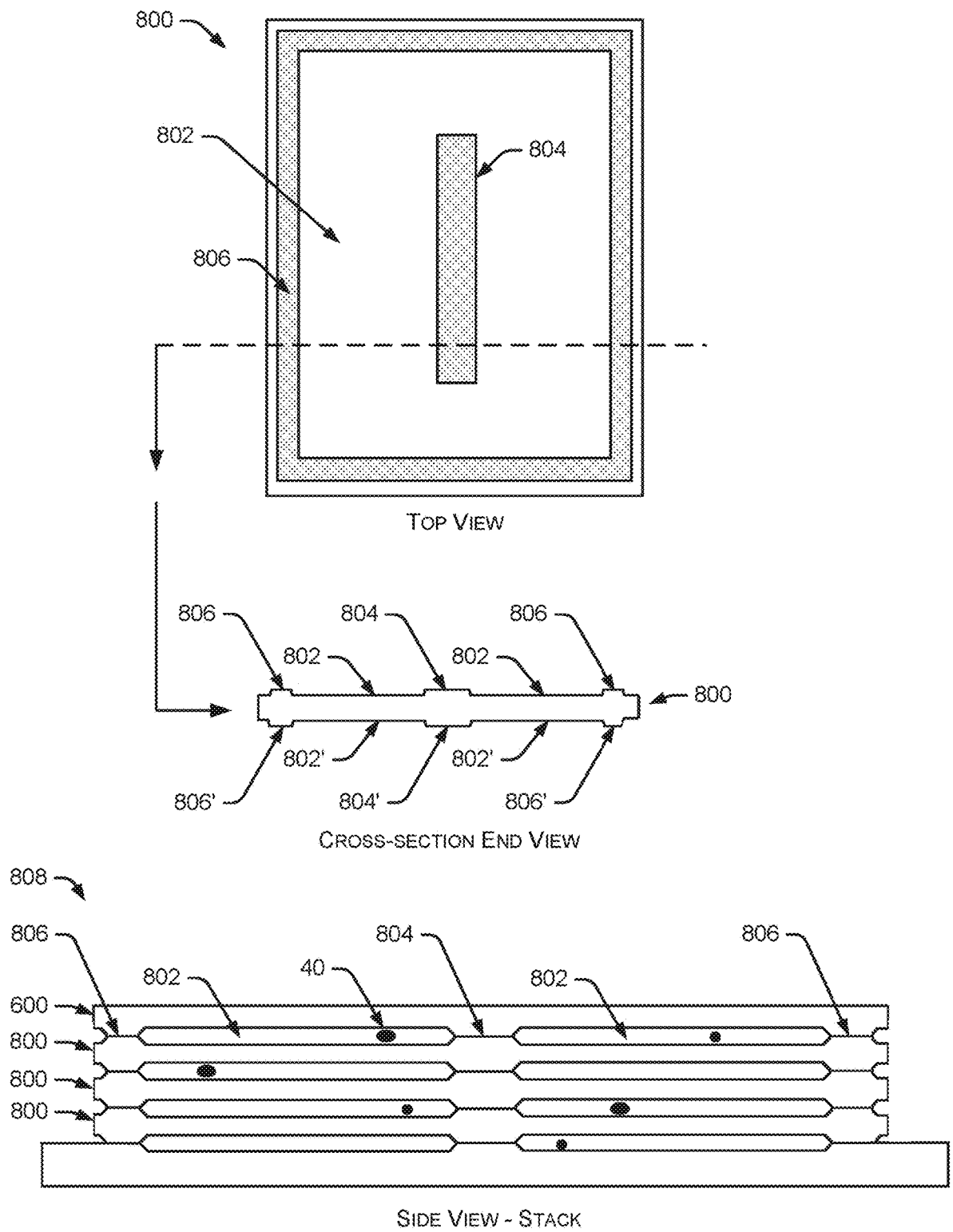
FIG. 8 is a diagram of an example bonding surface with large area non-bonded areas, or recesses, on both sides of a die or wafer, for making stacked structures.

FIG. 8 shows a die or wafer with large area recesses 802 (non-bonding areas) for capturing contaminants on both front and back sides of the die or wafer. The example in FIG. 8 differs from the example in FIG. 6, in that the die or wafer that is shown has example bonding areas 804 & 806 on both top and bottom sides of the die or wafer. The recesses 802 on each side of the two-sided die or wafer may be large area recesses 802, as shown, but can also be recesses 802 with small or even microscopic horizontal spans. Bonding with another surface on another die or wafer occurs at bonding footprints 804 & 804' and 806 & 806', which expel contaminants, particles, and byproducts of the bonding reactions into the large area recesses 802 & 802', which bind or sequester the contaminants there.

As shown in stack 808, particles up to a certain size fit in the large area recesses 802 & 802', where they cannot further delaminate the bonded areas 804 & 804'. The large area recess 802 or 802' can accommodate contaminant particles 40 that are twice as large as the particles captured by the large area recess 602 in FIG. 6, when the stacked large area recesses 802 & 802' abut each other, providing twice the vertical height as the large area recess shown in FIG. 6. The respective large area recesses 802 & 802' completely surround each respective bonding footprint 804 & 804'. In an implementation, respective peripheral bonding areas 806 & 806' surround respective large area recesses 802 & 802' and become part of the surface area of the overall bond between bonded surfaces 800. The same large area recesses 802 & 802' also capture particles and contaminants from the peripheral bonding areas 806 & 806'.

Figure 9:
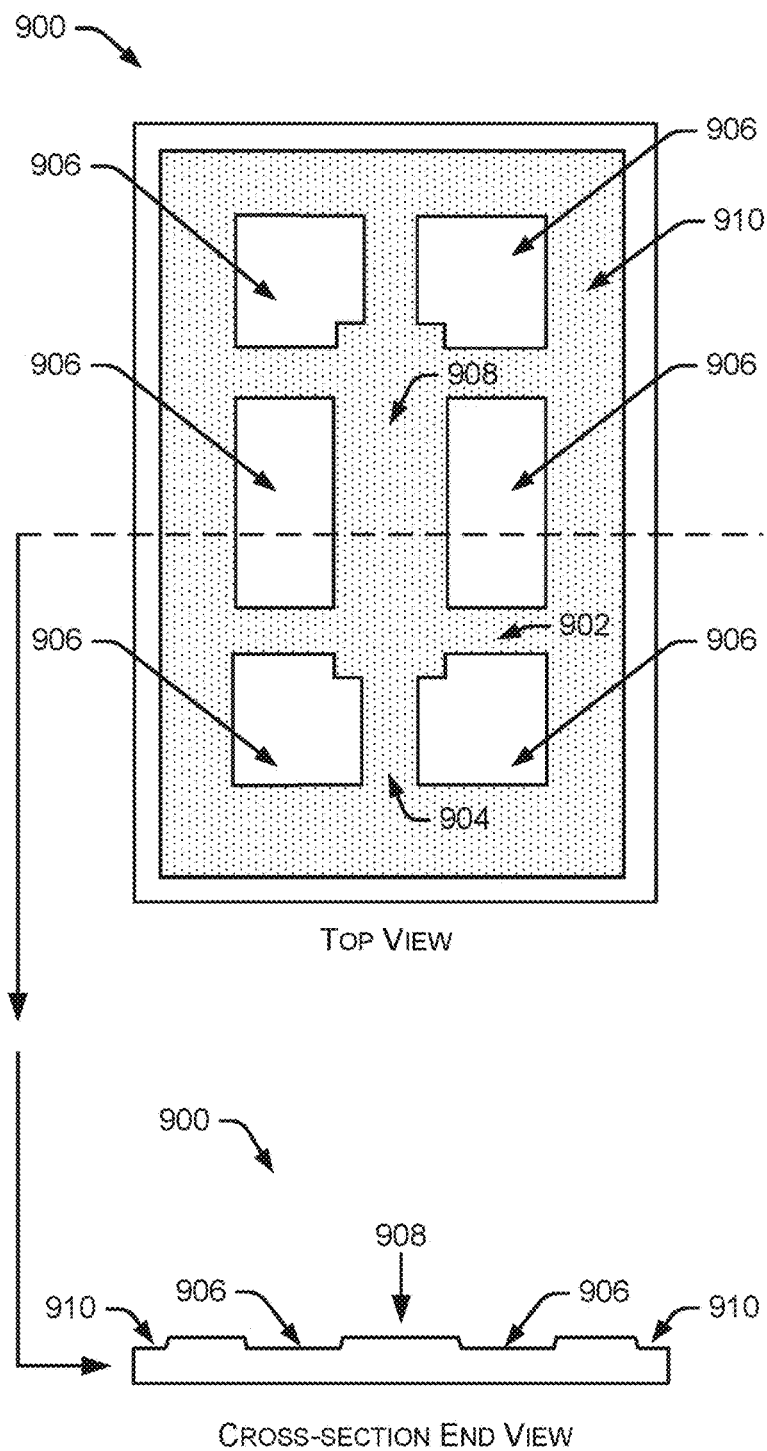
FIG. 9 is a diagram of an example bonding surface with large non-bonding areas, or recesses, for capturing contaminants and ribbed bonding areas for improving bond propagation and increasing the overall bond contact area between joined surfaces.

FIG. 9 shows an example bonding surface 900 that is a variation of the bonding surface 600 shown in FIG. 6. In FIG. 9, strips or ribs of bonding area, such as strips 902 & 904, are located between the central bonding area footprint 908 and the peripheral bonding area 910, connecting the two. The ribbed bonding area strips 902 & 904 improve bond propagation and increase the overall bond contact area between surfaces 900 being joined. The resulting large area recesses 906, although smaller than that in FIG. 6, trap particles and reaction byproducts to protect bond integrity. Bonding with another surface occurs in the central bonding area footprint 908, the peripheral bonding area 910, and the various rib bonding areas 902 & 904, all of which may off-put contaminants, particles, and byproducts of the bonding reaction to the large area recesses 906 located between these. Particles up to a certain size that fit in the large area recesses 906 are removed from causing or propagating further delamination in the bonded areas 908 & 910 & 902 & 904. Likewise, the large area recesses 906 also capture particles and contaminants from annealing steps.

Although FIGS. 6-9 show a central rectangular bonding area, characteristic for use in DRAM HBM applications, the layout of a given bonding surface can include multiple active bonding areas, and these can be separated by recessed areas to capture contaminants. Active bonding areas can also be connected together, with isolated recessed areas that have random shapes predesigned into the layout. One or more active bonding areas in a given implementation can be any shape, such as square, rectangular, circular, polygonal, star-shaped, and so forth.

Figure 10:
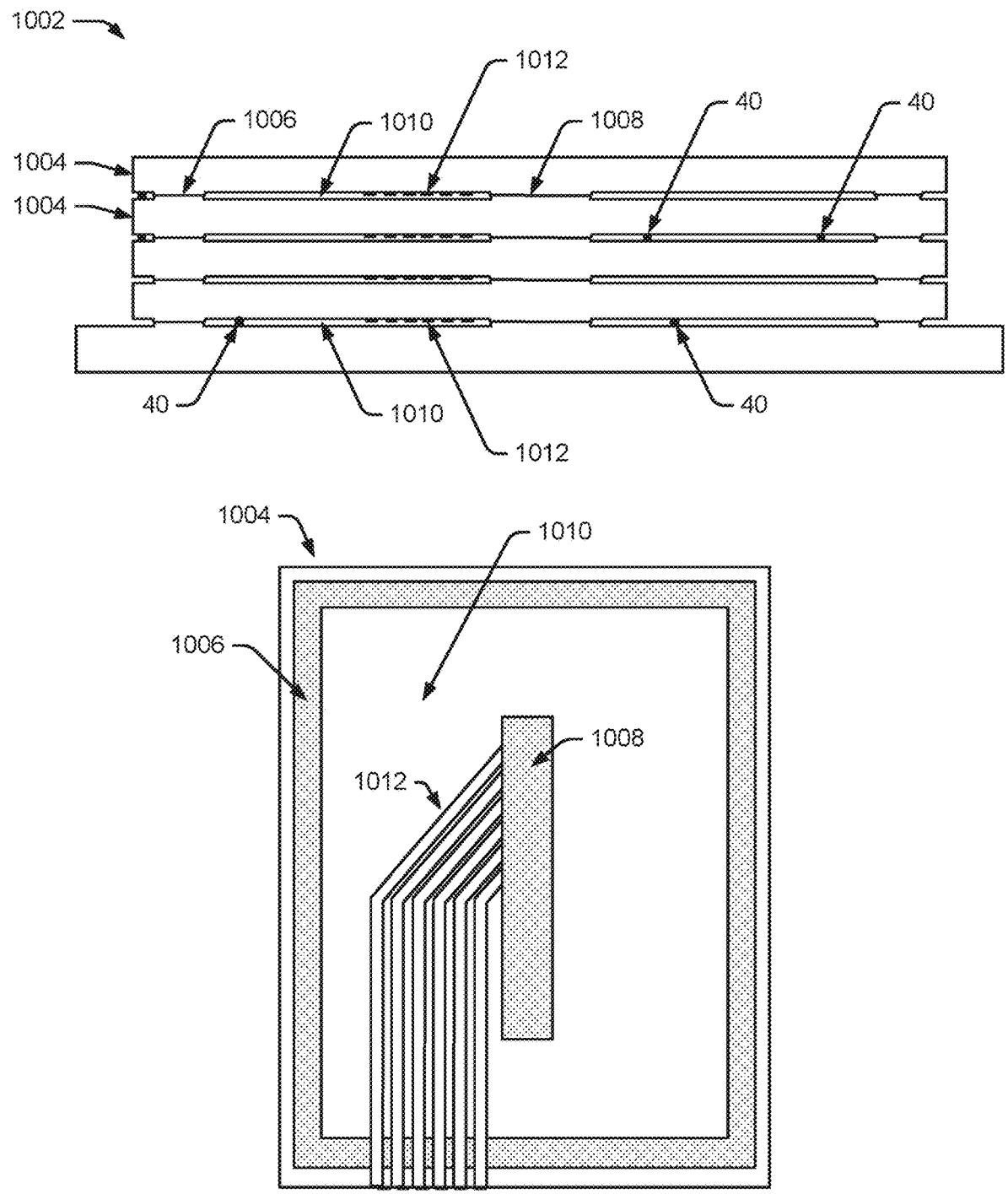
FIG. 10 is a diagram showing conductive traces in the large area recesses with resulting electrical benefits.

FIG. 10 shows a stack structure 1002, such as stacked dies 1004 that have been bonded into the stack 1002 by joining bonding surfaces of the example dies 1004 at bonding interfaces 1006 & 1008, for example. The large area recesses 1010 provide an electrical benefit for conductive traces 1012 that are placed to traverse the recesses 1010, causing signals that run in traces 1012 in the recesses 1010 to have lower dielectric loss, and lower capacitive loss than those traces 1012 embedded in or laminated between semiconductor materials such as silicon. The dielectric loss and the capacitive loss can be controlled, for example, by configuring a geometry of an air space in a given recess 1010. The signal-carrying benefit can be significant when the conductive traces 1012 traverse relatively large area recesses 1010.

Figure 11:
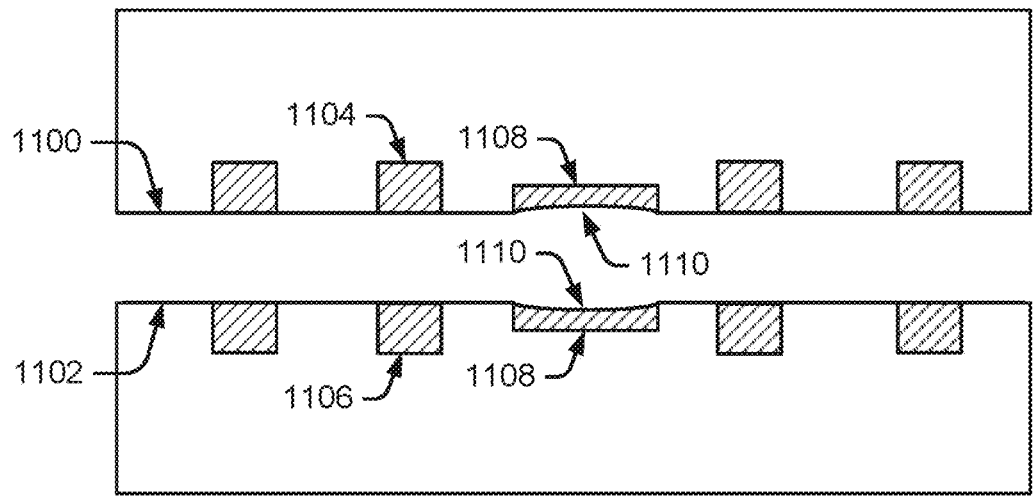
FIG. 11 is a diagram of surfaces for direct hybrid bonding, with pads indented or dished to capture contaminants and protect bond integrity.
Figure 11:
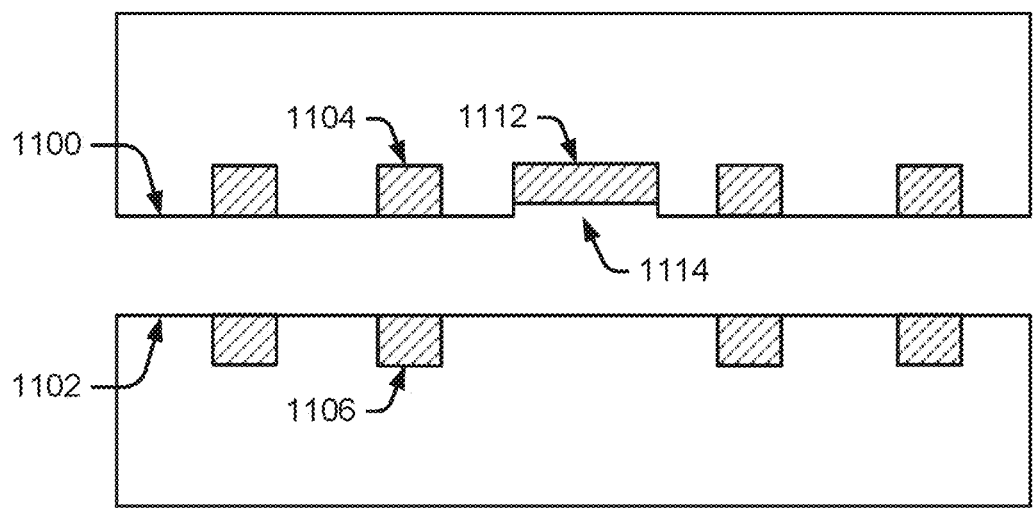

FIG. 11 shows a first bonding surface 1100 and a second bonding surface 1102, with conductive pads 1104 & 1106 for making an electrical interconnect to be joined from the respective surfaces 1100 & 1102 when the surfaces are bonded. The bonding surfaces 1100 & 1102 may be surfaces undergoing a D2W join or a W2W join. The bonding technique can be a direct dielectric bonding or direct hybrid bonding process. Relatively larger size pads 1108, which may be nonoperational dummy pads unconnected to circuitry, are distributed among the conductive pads 1104 & 1106. These larger pads 1108 are subject to a degree of dishing 1110 during one or more chemical mechanical planarization steps (CMP), creating deeper recesses 1110 in the pads 1108 compared to conventional recesses in pads 1104 or 1106 with narrower width. In an implementation, the deeper recesses can be placed to capture loose particles and bonding reaction byproducts. Significant dishing for capturing contaminants may occur or may be obtained to form an example recess 1110 when the width of the pad 1108 is 10 μm or greater, or at least two-times larger than the electrical conductive pads 1104 and 1106, which may be DBI pads, for example.

Alternatively, larger pads 1112 may be intentionally recessed from the bonding surface 1100 by design and manufacture. Such recessed pads 1112 can be wide or narrow, depending on the amount of contaminants to be captured to protect the bond. As the bond is formed, some particles and gaseous byproducts of the bonding reaction tend to move to any space available as the gap between surfaces 1100 & 1102 disappears, resulting in contaminants and byproducts being trapped in the recess 1114. Locations of particle build-up can also be determined by calculation or observation. The larger pads 1112 with predesigned recesses 1114 can be placed at the determined locations of particle build-up.

CSAM, or confocal scanning acoustic microscopy images, have shown that the predesigned recesses successfully sequester particles and bond reaction byproducts, resulting in very few bonding voids. The absence of voids provides a strong bond with high bond integrity and full electrical connection of bonded interconnects. Electrical tests of the bonded interconnects affirm the results of the CSAM images, that the example predesigned recesses result in a notable absence of undesirable bonding voids.

Example Methods

Figure 12:
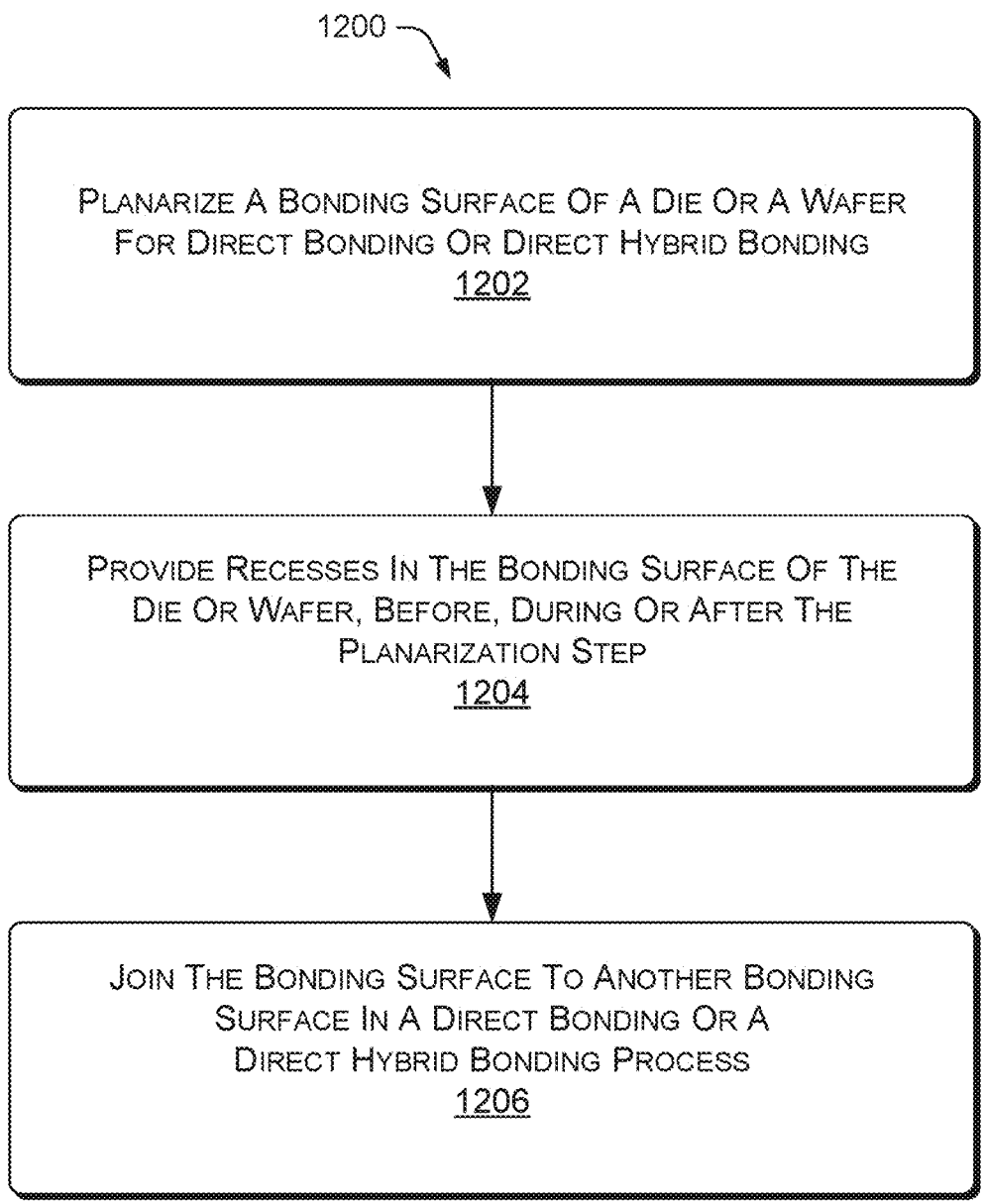
FIG. 12 is a flow diagram of an example method of enhancing bonds in microelectronic devices.

FIG. 12 shows an example method 1200 for enhancing bonds in microelectronic devices. Operations of the example method 1200 are shown in individual blocks.

At block 1202, recesses are provided in a bonding surface of a die or wafer.

At block 1204, the bonding surface is planarized to flatness for direct-bonding. The example method 1200 may be used with other general types of bonding operations. CMP or other measures may be used to obtain a surface flatness suitable for direct-bonding and direct hybrid bonding processes. Some or all of the recesses may be formed during or after this step instead of at block 1202.

At block 1206, the bonding surface is joined in a direct-bonding operation or a direct hybrid bonding operation to another bonding surface, allowing the recesses to capture particles, contaminants, and bonding reaction byproducts.

Figure 13:
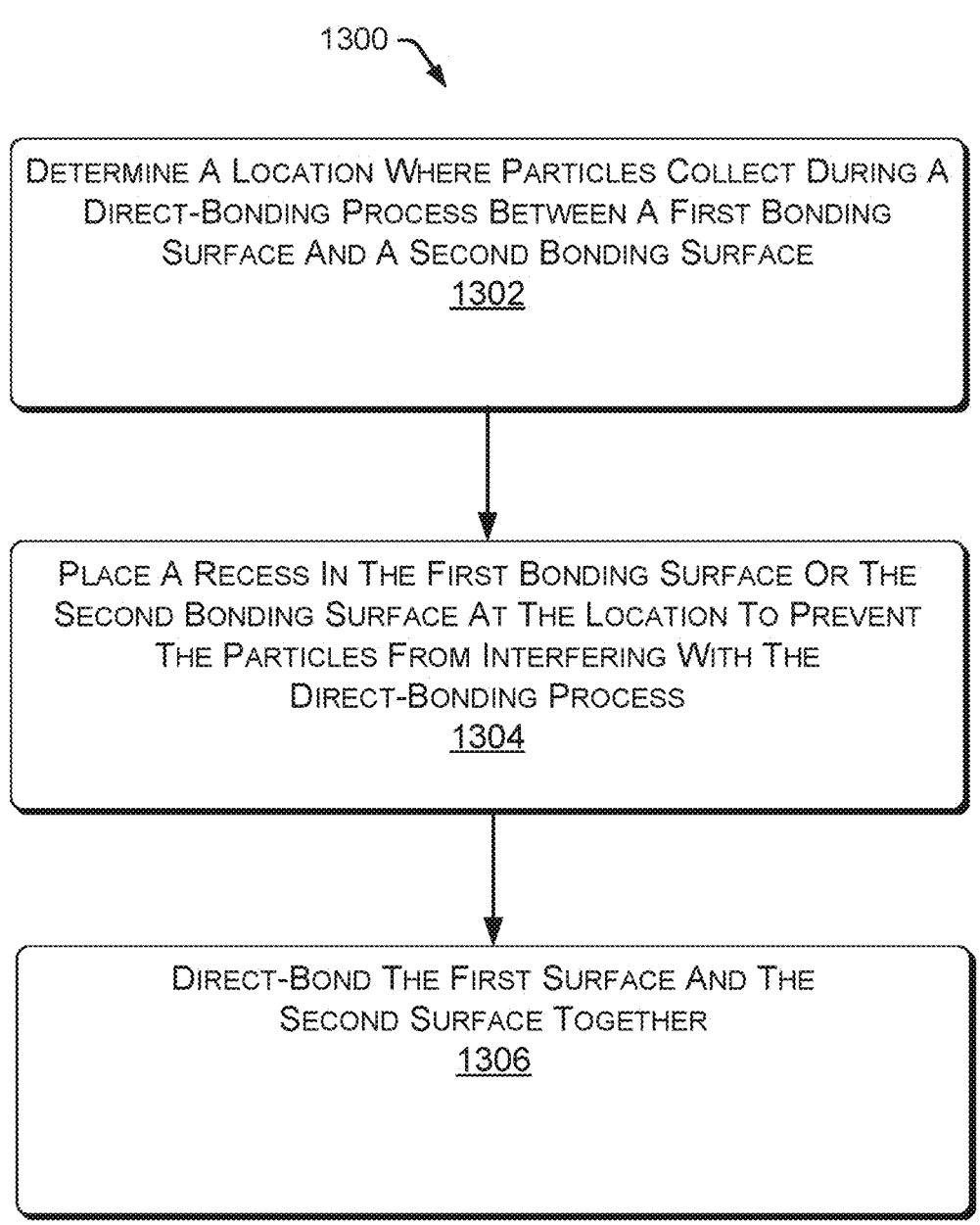
FIG. 13 is a flow diagram of an example method of enhancing bonds in microelectronic devices by determining locations of contaminants and capturing the contaminants.

FIG. 13 shows another example method 1300 for enhancing bonds in microelectronic devices. Operations of the example method 1300 are shown in individual blocks.

At block 1302, a location is determined at which particles collect during a direct-bonding process between a first bonding surface and a second bonding surface, wherein propagation of a bonding wave front during the direct-bonding process mobilizes and moves the particles.

At block 1304, a recess is placed in the first bonding surface or the second bonding surface at the location to prevent the particles from interfering with the direct-bonding process.

At block 1306, the first surface and the second surface are direct-bonded together.

A recess may be placed in both the first bonding surface and the second bonding surface at or near the location.

A first recess in the first bonding surface may be vertically aligned with a second recess in the second bonding surface across a bonding interface between the first bonding surface and the second bonding surface, to make an additive or composite recess across the bonding interface.

In an implementation, predesigned recesses can be created in a bonding surface by etching. Locations where build-up of particles occurs in higher concentrations can be determined by calculating or observing propagation of a bonding wave front proceeding from one side of an active bonding area to an opposing side of the active bonding area. Or, the bonding wave front may proceed from a center line of an active bonding area to two opposing sides of the active bonding area. Likewise, the bonding wave front may proceed from a center point of an active bonding area to four sides of the active bonding area (or may propagate in even more directions and to more sides).

Linear recesses, or a pattern of one or more lines of point recesses, may be placed at right angles to a direction of bonding wave propagation to collect the particles.

Recess dimensions can vary according to application and according to the likely contaminants. In an implementation, the horizontal width of a recess may be less than one micron or may even be nanometers in extent, and larger up to hundreds of microns in width.

The depth dimension of an example recess can range from a few nanometers to several microns. The depth of the recess (es) may be larger than pad thickness used in a direct hybrid bonding (e.g., DBI) bonding process. The recess (es) may be devoid of active componentry, MEMS devices, etc., in order to isolate the contaminants away from potentially sensitive areas of the microelectronic devices. The recess (es) may also be limited in the x, y, and z directions to maximize regions for circuitry, MEMS, or other operational features.

In an implementation, predesigned recesses can also be implemented in some wafers, for example, by selecting or creating a material with a given porosity or other inherent pattern of recesses.

Figure 14:
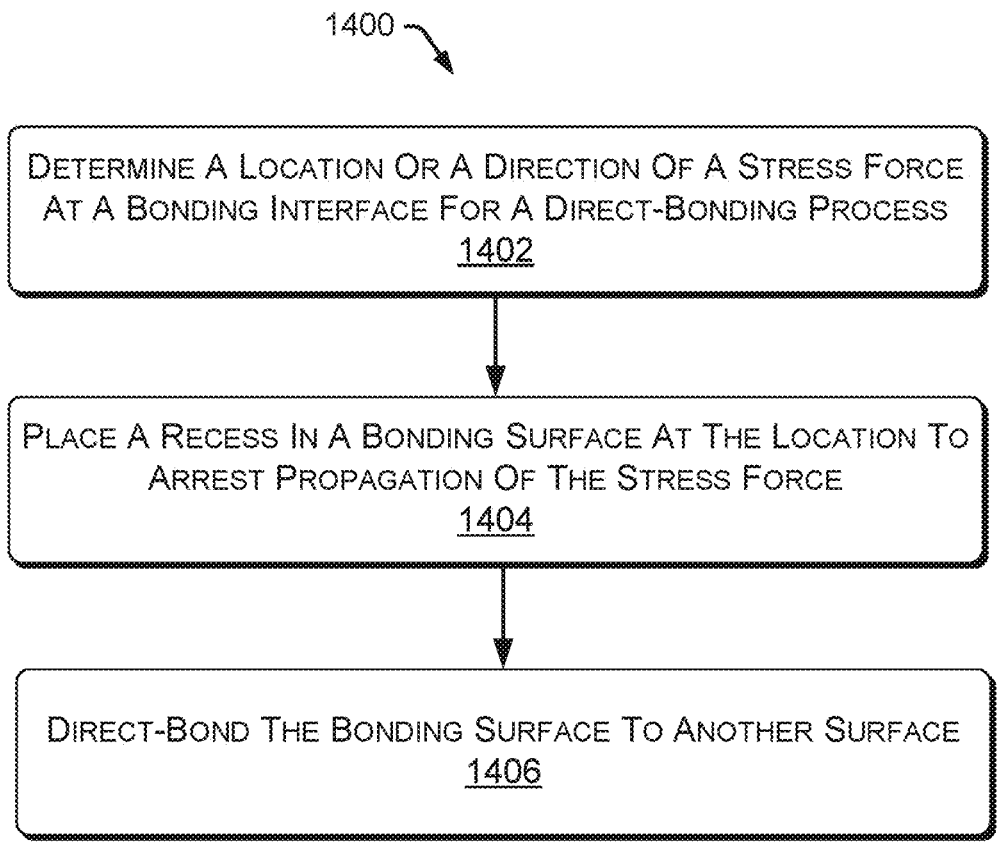
FIG. 14 is a flow diagram of an example method of enhancing bonds in microelectronic devices by placing a recess in a bonding surface to arrest stress forces.

FIG. 14 shows another example method 1400 for enhancing bonds in microelectronic devices. Operations of the example method 1400 are shown in individual blocks.

At block 1402, a location or the direction of likely propagation of a stress force is determined for a bonding interface of a direct-bonding operation.

At block 1404, one or more recesses are placed in a bonding surface at the location or along the direction, to arrest propagation of the stress force. In an implementation, a pattern of periodic recesses or holes can provide "breaks" for stress forces acting in the horizontal plane of a microscale direct-bonding interface.

At block 1406, the bonding surface with the one or more recesses is direct-bonded to another surface.

Figure 15:
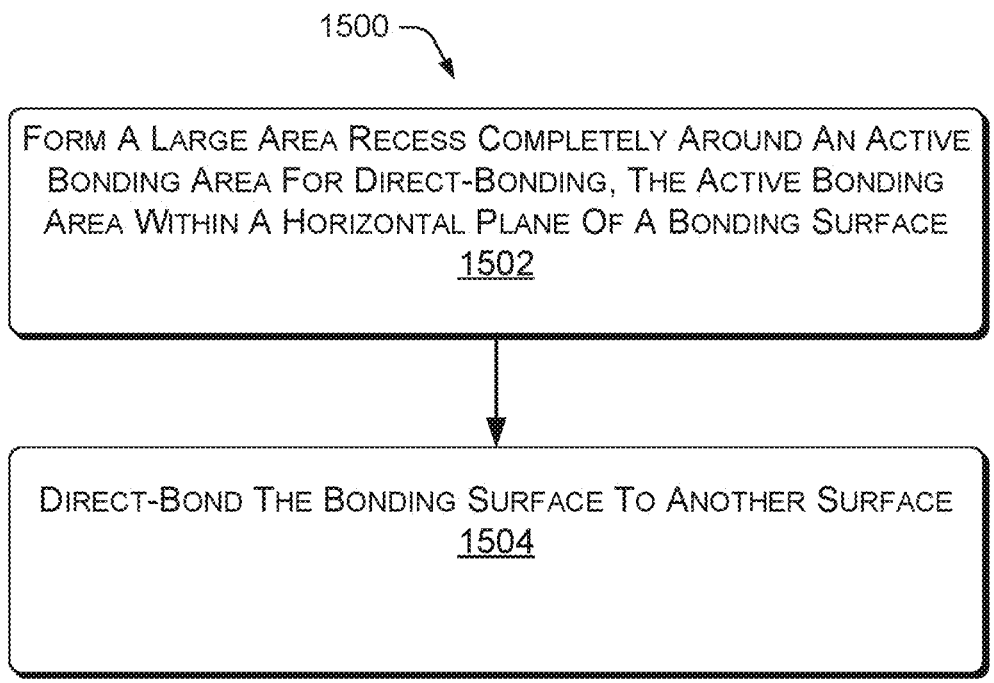
FIG. 15 is a flow diagram of an example method of building large area recesses around direct-bonding areas to capture contaminants around the direct-bonding areas in microelectronic devices.

FIG. 15 shows another example method 1500 for enhancing bonds in microelectronic devices. Operations of the example method 1500 are shown in individual blocks.

At block 1502, a large area recess is formed completely around an active bonding area for direct-bonding, the active bonding area within a horizontal plane of a bonding surface.

At block 1504, the bonding surface is direct-bonded to another surface, with the large area recess capturing contaminants adverse to the direct-bonding in the active bonding area.

Figure 16:
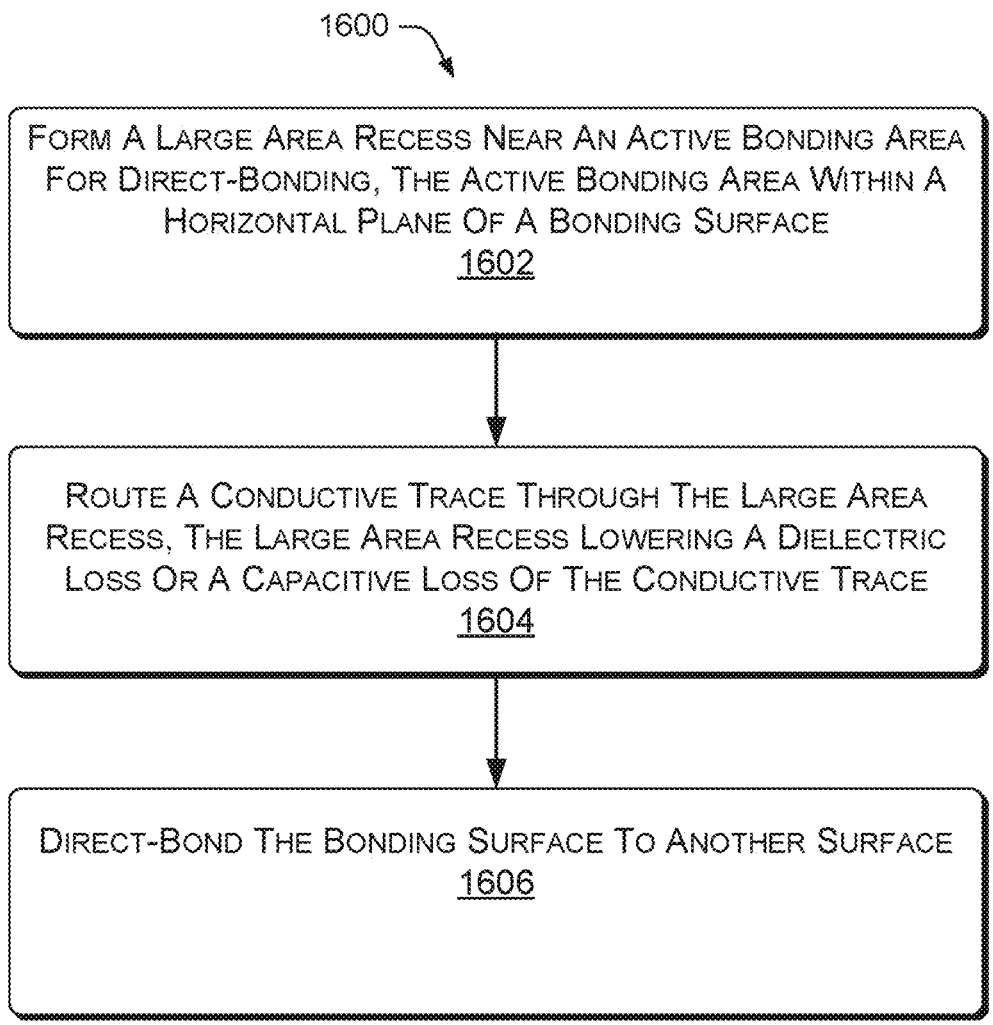
FIG. 16 is a flow diagram of an example method of improving electrical characteristics of conductive traces by routing the traces in large area recesses.

FIG. 16 shows another example method 1600 for enhancing bonds in microelectronic devices. Operations of the example method 1600 are shown in individual blocks.

At block 1602, a large area recess is formed near an active bonding area for direct-bonding. The active bonding area is within a horizontal plane of a bonding surface.

At block 1604, a conductive trace is routed through the large area recess. The large area recess lowers the dielectric loss and/or capacitive loss of the conductive trace.

At block 1606, the bonding surface is direct-bonded to another surface. The large area recess captures contaminants adverse to the direct-bonding that occurs in the active bonding area.

Figure 17:
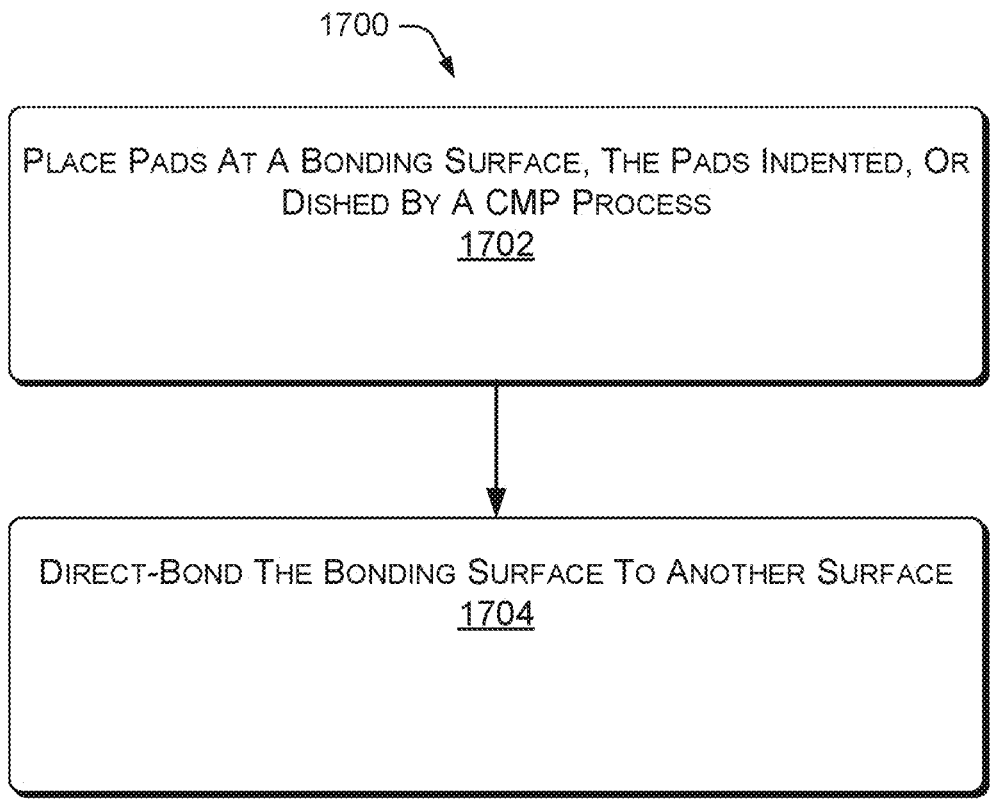
FIG. 17 is a flow diagram of an example method of placing indented or dished pads at a bonding surface to collect contaminants and enhance bonds in microelectronic devices.

FIG. 17 shows another example method 1700 for enhancing bonds in microelectronic devices. Operations of the example method 1700 are shown in individual blocks.

At block 1702, pads placed at a bonding surface are indented, or dished by a chemical mechanical planarization (CMP) process.

At block 1704, the bonding surface is direct-bonded to another surface, while the indented or dished pads capture contaminants detrimental to the direct-bonding process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, quantities, material types, fabrication steps and the like can be different from those described above in alternative embodiments. The term "coupled" is used herein to express a direct connection as well as a connection through one or more intervening circuits or structures. The terms "example," "embodiment," and "implementation" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. An apparatus, comprising:
 a first bonding surface of a microelectronic component, the first bonding surface including a first dielectric material;
 a second bonding surface directly bonded with the first bonding surface, the second bonding surface including a second dielectric material;
 at least one recessed non-bonded area containing no electrically operational elements, the at least one recessed non-bonded area being disposed in, and bounded by, either the first dielectric material of the first bonding surface or second dielectric material of the second bonding surface, the at least one recessed non-bonded area comprising a first recess surrounding a central portion of the first bonding surface, and the first bonding surface further comprising a peripheral portion of the first bonding surface.

2. The apparatus of claim 1, wherein recesses in the first bonding surface align with recesses in the second bonding surface.

3. The apparatus of claim 1, further comprising a coating or a deposition of absorption, adsorption or occlusion material in the at least one recessed non-bonded area to absorb, adsorb, or occlude a bonding or annealing byproduct.

4. The apparatus of claim 1, wherein the at least one recessed non-bonded area further comprises a second recess surrounding the peripheral portion of the first bonding surface.

5. The apparatus of claim 1, wherein the first and second bonding surfaces comprise metal contacts, and the first and second bonding surfaces are direct hybrid bonded.

6. A direct hybrid bonded apparatus, comprising:
 a first bonding surface of a first microelectronic component;
 first conductors disposed at the first bonding surface, the first conductors positioned to make electrical contacts;
 a second bonding surface of a second microelectronic component directly bonded with the first bonding surface at a bond interface;
 second conductors disposed at the second bonding surface, the second conductors directly bonded with respective ones of the first conductors disposed at the first bonding surface;
 a recessed metal pad below the first bonding surface, the recessed metal pad being a dummy pad unconnected to circuitry, the recessed metal pad being laterally wider than the first conductors, the recessed metal pad being sufficiently recessed relative to the first bonding surface to maintain a vertical gap between the recessed metal pad and the second bonding surface in the direct hybrid bonded apparatus.

7. The apparatus of claim 6, wherein the recessed metal pad has a dished surface characteristic of chemical-mechanical planarization (CMP) of the first bonding surface.

8. The apparatus of claim 6, further comprising a second recessed metal pad below the second bonding surface, the second recessed metal pad being laterally wider than the second conductors.

9. The apparatus of claim 8, wherein the recessed metal pad below the first bonding surface and the second recessed metal pad below the second bonding surface overlap partially or fully to form a merged vertical gap across the bonding interface.

10. The apparatus of claim 6, wherein the recessed metal pad is recessed relative to the first bonding surface greater than a thickness of the recessed metal pad.

11. A bonding structure for components of microelectronic devices, comprising:
- a first bonding surface of a wafer or die, the first bonding surface including a first dielectric material;
- a first recessed non-bonding area surrounding most or all of the first bonding surface, the first recessed non-bonding area comprising an etched recess in the first dielectric material and containing no metal connected to circuitry; and
- a second bonding surface of the wafer or die surrounding most or all of the first recessed non-bonding area.

12. The bonding structure of claim 11, wherein the etched recess contains byproducts and contaminants detrimental to the bonding process.

13. The bonding structure of claim 11, further comprising another wafer or another die with an instance of the first bonding surface, the first recessed non-bonding area, the second bonding surface, and a second recessed non-bonding area on at least one side of the another wafer or die, for creating stacked bonded structures.

14. The bonding structure of claim 11, further comprising additional recesses in the first bonding surface and the second bonding surface to arrest propagation of a debonding process or a delamination process in the first bonding surface or the second bonding surface.

15. The bonding structure of claim 11, further comprising ribs between the first bonding surface and the second bonding surface to connect the first bonding surface and the second bonding surface into a continuous bonding area, the ribs facilitating bond propagation during a bonding process and increasing an overall bonding area.

16. The bonding structure of claim 11, further comprising conductive traces running at least horizontally across the first recessed non-bonding area, the etched recess configured to impart a reduced dielectric loss and a reduced capacitive loss to signals of the conductive traces.

17. The bonding structure of claim 11, further comprising metal contacts in the first bonding surface, the first bonding surface being planarized and suitable for direct hybrid bonding.

18. An apparatus, comprising:
- a first bonding area of a wafer or die, the first bonding area configured for direct bonding and including a dielectric material;
- a second bonding area of the wafer or die, the second bonding area surrounding the first bonding area, including the dielectric material, and configured for direct bonding;
- a first recessed non-bonding area at least substantially surrounding the first bonding area, the first recessed non-bonding area comprising at least one etched recess bounded by the dielectric material and separating the first bonding area from the second bonding area; and
- a second recessed non-bonding area disposed along an entire outer perimeter of the wafer or die, surrounding the second bonding area.

19. An apparatus according to claim 18, further comprising conductive traces traversing the first and/or second recessed non-bonding areas.

20. An apparatus according to claim 18, wherein the first bonding area and/or the second bonding area comprises metal contacts and is configured for direct hybrid bonding.

* * * * *

UNITED STATES PATENT AND TRADEMARK OFFICE
CERTIFICATE OF CORRECTION

| | | |
|---|---|---|
| PATENT NO. | : 11,967,575 B2 | Page 1 of 1 |
| APPLICATION NO. | : 17/681019 | |
| DATED | : April 23, 2024 | |
| INVENTOR(S) | : Guilian Gao | |

It is certified that error appears in the above-identified patent and that said Letters Patent is hereby corrected as shown below:

In the Specification

Column 1, Line 58, delete "(10)" and insert -- (IO) --.

Signed and Sealed this
Sixth Day of August, 2024

Katherine Kelly Vidal
*Director of the United States Patent and Trademark Office*